(12) United States Patent
Kondo et al.

(10) Patent No.: US 8,362,563 B2
(45) Date of Patent: Jan. 29, 2013

(54) THIN FILM TRANSISTOR, METHOD FOR MANUFACTURING THE SAME, AND SEMICONDUCTOR DEVICE

(75) Inventors: Toshikazu Kondo, Atsugi (JP); Hideyuki Kishida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/558,638

(22) Filed: Jul. 26, 2012

(65) Prior Publication Data

US 2012/0286278 A1 Nov. 15, 2012

Related U.S. Application Data

(62) Division of application No. 12/699,080, filed on Feb. 3, 2010, now Pat. No. 8,247,276.

(30) Foreign Application Priority Data

Feb. 20, 2009 (JP) .................. 2009-037912

(51) Int. Cl.
*H01L 27/12* (2006.01)
*H01L 29/66* (2006.01)

(52) U.S. Cl. .. 257/352; 257/347; 257/353; 257/E29.151

(58) Field of Classification Search .......... 257/57, 257/66, 347, 352, 353, E29.151
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A | 12/2006 |
| EP | 2 226 847 A | 9/2010 |

(Continued)

OTHER PUBLICATIONS

Prins et al., "A Ferroelectric Transparent Thin-Film Transistor," Appl. Phys. Lett. (Applied Physics Letters), vol. 68, No. 25, pp. 3650-3652, Jun. 17, 1996.

(Continued)

*Primary Examiner* — Ngan Ngo
(74) *Attorney, Agent, or Firm* — Eric J. Robinson; Robinson Intellectual Property Law Office, P.C.

(57) ABSTRACT

In a thin film transistor, an increase in off current or negative shift of the threshold voltage is prevented. In the thin film transistor, a buffer layer is provided between an oxide semiconductor layer and each of a source electrode layer and a drain electrode layer. The buffer layer includes a metal oxide layer which is an insulator or a semiconductor over a middle portion of the oxide semiconductor layer. The metal oxide layer functions as a protective layer for suppressing incorporation of impurities into the oxide semiconductor layer. Therefore, in the thin film transistor, an increase in off current or negative shift of the threshold voltage can be prevented.

27 Claims, 17 Drawing Sheets

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,058 B2 | 7/2009 | Yamazaki et al. |
| 7,674,650 B2 | 3/2010 | Akimoto et al. |
| 7,732,819 B2 | 6/2010 | Akimoto et al. |
| 7,768,009 B2 | 8/2010 | Kobayashi et al. |
| 7,791,075 B2* | 9/2010 | Kobayashi et al. ............ 257/59 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0065784 A1* | 3/2009 | Kobayashi et al. ............ 257/72 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294765 A1* | 12/2009 | Tanaka et al. .................. 257/43 |
| 2010/0025677 A1* | 2/2010 | Yamazaki et al. ............. 257/43 |
| 2010/0025678 A1 | 2/2010 | Yamazaki et al. |
| 2010/0035379 A1* | 2/2010 | Miyairi et al. ................ 438/104 |
| 2010/0133530 A1 | 6/2010 | Akimoto et al. |
| 2010/0140612 A1 | 6/2010 | Omura et al. |
| 2010/0163868 A1 | 7/2010 | Yamazaki et al. |
| 2010/0193783 A1 | 8/2010 | Yamazaki et al. |
| 2010/0244034 A1 | 9/2010 | Miyairi |
| 2010/0285624 A1 | 11/2010 | Kobayashi et al. |
| 2010/0301326 A1 | 12/2010 | Miyairi et al. |
| 2010/0304515 A1 | 12/2010 | Kobayashi et al. |
| 2011/0108833 A1 | 5/2011 | Yamazaki et al. |
| 2011/0114942 A1 | 5/2011 | Akimoto et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0291089 A1 | 12/2011 | Akimoto et al. |
| 2012/0129288 A1* | 5/2012 | Kobayashi et al. ............ 438/34 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-250983 A | 9/2007 |
| WO | WO 2004/114391 | 12/2004 |
| WO | WO 2007/119386 | 10/2007 |

OTHER PUBLICATIONS

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$ =3, 4, and 5), $InGaO_3(ZnO)_3$, and $Ga_2O_3(ZnO)_m$ ($m$ =7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$ ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display using CG-Silicon Technology," SID Digest '04: SID International Symposium Digest of Technical Papers, 2004, vol. 35, pp. 860-863.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTS," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2A_3$-$A_2O_3$-BO Systems [A: Fe, Ga, Or Al; B: Mg, Mn, Fe, Ni, Cu, or ZN] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO $(Ga_2O_3-In_2O_3-ZnO)$ TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

* cited by examiner

FIG. 12A  TiO$_2$ (Anatase type)
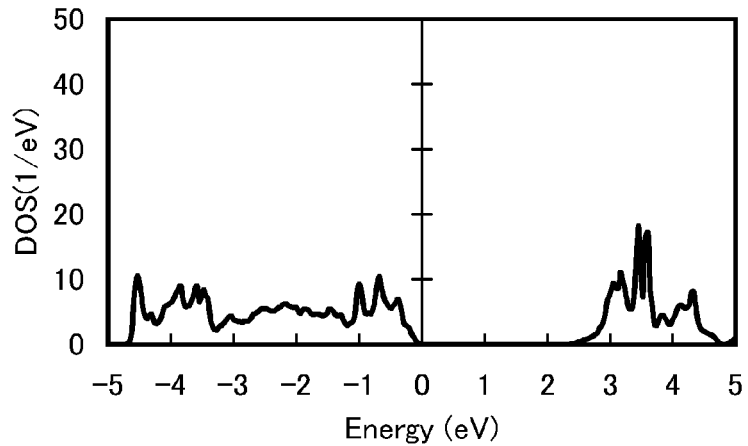
FIG. 12B  TiO$_2$ (Rutile type)
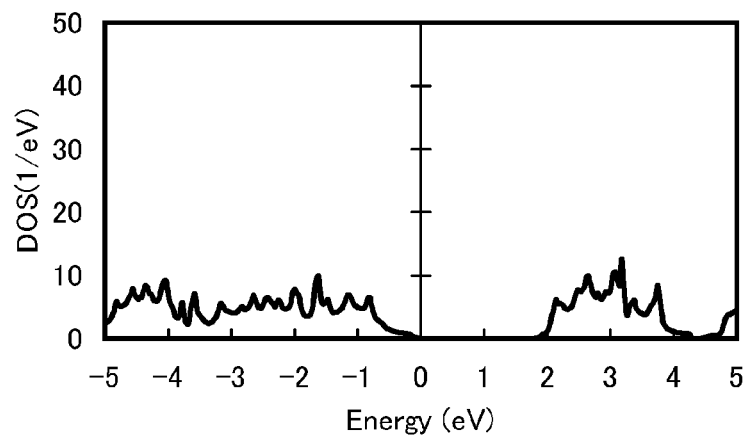
FIG. 12C  TiO$_2$ (Brookite type)
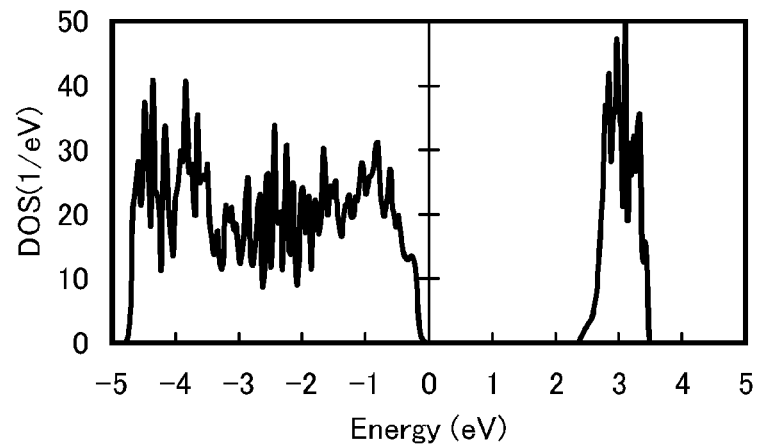

THIN FILM TRANSISTOR, METHOD FOR MANUFACTURING THE SAME, AND SEMICONDUCTOR DEVICE

BACKGROUND OF THE INVENTION

1. Field of the Invention

The present invention relates to a thin film transistor formed using an oxide semiconductor layer, and a method for manufacturing the thin film transistor. In addition, the present invention relates to a semiconductor device manufactured using the thin film transistor.

Note that a semiconductor device in this specification indicates all the devices that can operate by using semiconductor characteristics, and electro-optical devices, semiconductor circuits, and electronic appliances are all included in the category of the semiconductor devices.

2. Description of the Related Art

A wide variety of metal oxides exist and are used for various applications. Indium oxide is a well-known material and is used as a transparent electrode material needed for a liquid crystal display and the like.

Some metal oxides exhibit semiconductor characteristics. As metal oxides exhibiting semiconductor characteristics, for example, tungsten oxide, tin oxide, indium oxide, zinc oxide, and the like can be given. References disclose a thin film transistor in which such a metal oxide exhibiting semiconductor characteristics is used for a channel formation region (Patent Documents 1 to 4, and Non-Patent Document 1).

As metal oxides, multi-component oxides as well as single-component oxides are known. For example, $InGaO_3(ZnO)_m$ (m is a natural number) belonging to homologous series has been known as a multi-component oxide semiconductor including In, Ga, and Zn (Non-Patent Documents 2 to 4).

In addition, it has been confirmed that an oxide semiconductor including such an In—Ga—Zn-based oxide can be used as a channel layer of a thin film transistor (Patent Document 5, and Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun., 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350"C", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

An object of an embodiment of the present invention is to prevent, in a thin film transistor, an increase in off current or negative shift of the threshold voltage.

An object of an embodiment of the present invention is to realize ohmic contact between an oxide semiconductor layer and each of a source electrode layer and a drain electrode layer of a thin film transistor.

An object of an embodiment of the present invention is to efficiently manufacture a high-performance thin film transistor in which an increase in off current or negative shift of the threshold voltage is prevented.

An object of an embodiment of the present invention is to efficiently manufacture a high-performance thin film transistor in which an increase in off current or negative shift of the threshold voltage is prevented and which has ohmic contact between an oxide semiconductor layer and each of a source electrode layer and a drain electrode layer.

An object of an embodiment of the present invention is to provide a semiconductor device with high performance or high reliability.

An embodiment of the present invention is an inverted staggered thin film transistor in which a buffer layer is provided over an oxide semiconductor layer and a source electrode layer and a drain electrode layer are provided over the buffer layer. Note that the buffer layer includes a pair of conductive layers provided over opposite end portions of the oxide semiconductor layer, and a metal oxide layer which is provided over a middle portion of the oxide semiconductor layer, has the same metal element as the pair of conductive layers, has higher oxygen concentration than the pair of conductive layers, and is an insulator or a semiconductor provided between the pair of conductive layers.

Another embodiment of the present invention is a thin film transistor which has the above structure and in which the buffer layer includes a pair of oxide semiconductor layers whose oxygen concentration is lowered and which are provided over opposite end portions of the oxide semiconductor layer, and a pair of conductive layers containing oxygen at high concentration and provided over the pair of oxide semiconductor layers whose oxygen concentration is lowered.

Note that in this specification, the term "insulator" means a substance whose electrical resistivity is greater than or equal to $10^6$ ($\Omega \cdot m$), the term "semiconductor" means a substance whose electrical resistivity is greater than or equal to $10^{-3}$ (Ω·m) and less than $10^6$ (Ω·m), and the term "conductor" means a substance whose electrical resistivity is less than $10^{-3}$ (Ω·m).

Another embodiment of the present invention is a method for manufacturing a thin film transistor in which a metal oxide layer is formed by performing oxidation treatment on a conductive layer formed in the same step as an oxide semiconductor layer. Note that in the oxidation treatment, a resist used for forming a source electrode layer and a drain electrode layer is used as a mask. Therefore, opposite end portions of the conductive layer remain without being oxidized by the oxidation treatment. As a result, through the oxidation treatment, a pair of conductive layers and a metal oxide layer provided between the pair of conductive layers are formed.

Another embodiment of the present invention is a method for manufacturing a thin film transistor in which a metal oxide layer is formed by performing oxidation treatment on a conductive layer formed in the same step as an oxide semiconductor layer, and then, a pair of conductive layers containing oxygen at high concentration and a pair of oxide semiconductor layers whose oxygen concentration is lowered are formed by diffusing oxygen through thermal treatment.

Another embodiment of the present invention is a method for manufacturing a thin film transistor in which a metal oxide layer, a pair of conductive layers containing oxygen at high concentration, and a pair of oxide semiconductor layers whose oxygen concentration is lowered are formed through thermal oxidation treatment.

Another embodiment of the present invention is a method for manufacturing a thin film transistor in which a metal oxide layer, a pair of conductive layers containing oxygen at high concentration, and a pair of oxide semiconductor layers whose oxygen concentration is lowered are formed through oxidation treatment and thermal oxidation treatment.

Another embodiment of the present invention is a semiconductor device including the thin film transistor, and an interlayer insulating layer provided over the thin film transistor.

An embodiment of the present invention is an inverted staggered thin film transistor including a metal oxide layer which is an insulator or a semiconductor over a middle portion of an oxide semiconductor layer. The metal oxide layer functions as a protective layer for suppressing incorporation of impurities (such as hydrogen and moisture) into the oxide semiconductor layer. Therefore, in the thin film transistor, an increase in off current or negative shift of the threshold voltage can be prevented.

Another embodiment of the present invention is an inverted staggered thin film transistor including a pair of conductive layers containing oxygen at high concentration and a pair of oxide semiconductor layers whose oxygen concentration is lowered, between opposite end portions of an oxide semiconductor layer and a pair of conductive layers provided over the opposite end portions of the oxide semiconductor layer. The pair of oxide semiconductor layers whose oxygen concentration is lowered has lower resistance than the oxide semiconductor layer. Therefore, ohmic contact between the oxide semiconductor layer and each of a source electrode layer and a drain electrode layer can be obtained.

In another embodiment of the present invention, the metal oxide layer is formed on the basis of a conductive layer which is formed in the same step as the oxide semiconductor layer. Therefore, a high-performance thin film transistor can be efficiently formed.

In another embodiment of the present invention, the metal oxide layer is formed on the basis of a conductive layer which is formed in the same step as the oxide semiconductor layer, and the pair of oxide semiconductor layers whose oxygen concentration is lowered is formed by diffusing oxygen into the conductive layer. Therefore, a high-performance thin film transistor can be efficiently formed.

In another embodiment of the present invention, a thin film transistor including a protective layer for suppressing incorporation of impurities (such as hydrogen and moisture) into an oxide semiconductor layer is applied to a thin film transistor included in a semiconductor device. Accordingly, a material and a manufacturing method of an interlayer insulating layer provided over the thin film transistor can be selected depending on the purpose. That is, a semiconductor device with high performance or high reliability can be provided.

BRIEF DESCRIPTION OF THE DRAWINGS

FIGS. 12A to 12C are graphs each showing density of a state obtained by calculation described in Example 1.

DETAILED DESCRIPTION OF THE INVENTION

Figure 1A:
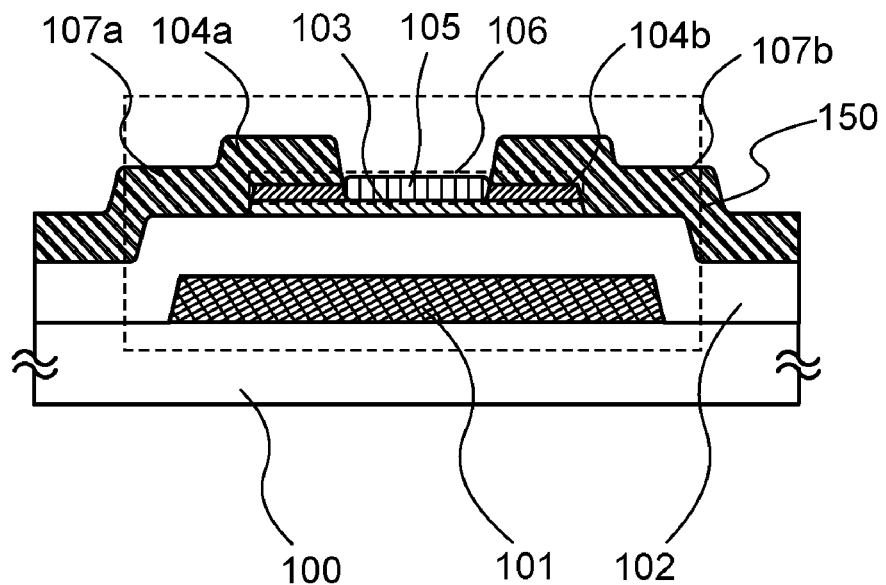
FIGS. 1A and 1B are cross-sectional views each illustrating a thin film transistor described in Embodiment 1.

Embodiments and an example of the present invention will be hereinafter described in detail with reference to the accompanying drawings. However, the present invention is not limited to the description below, and those skilled in the art will appreciate that a variety of modifications can be made to the modes and details without departing from the spirit and scope of the present invention. Therefore, the present invention is not construed as being limited to description of embodiments and an example below.

Note that the size, the thickness of a layer, or a region of each structure illustrated in drawings or the like in embodiments is exaggerated for simplicity in some cases. Therefore, the scale is not necessarily limited to that illustrated in the drawings or the like. Further, in this specification, ordinal numbers such as "first", "second", and "third" are used in order to avoid confusion among components, and the terms do not limit the components numerically.

Embodiment 1

In this embodiment, a structure of a thin film transistor which is one embodiment of the present invention will be described with reference to FIGS. 1A and 1B. Next, characteristics of the thin film transistor will be described.

FIG. 1A illustrates a cross-sectional view of a thin film transistor 150 formed over a substrate 100. The thin film transistor 150 includes a gate electrode layer 101 provided over the substrate 100, a gate insulating layer 102 provided over the gate electrode layer 101, an oxide semiconductor layer 103 provided over the gate insulating layer 102, a buffer layer 106 provided over the oxide semiconductor layer 103 and including a pair of conductive layers 104a and 104b which are conductors and a metal oxide layer 105 which is an insulator or a semiconductor, a source electrode layer 107a provided over the conductive layer 104a (one of the pair of conductive layers 104a and 104b), and a drain electrode layer 107b provided over the conductive layer 104b (the other of the pair of conductive layers 104a and 104b). Note that the pair of conductive layers 104a and 104b is provided over opposite end portions of the oxide semiconductor layer 103, and the metal oxide layer 105 is provided over a middle portion of the oxide semiconductor layer 103.

In other words, the thin film transistor 150 in FIG. 1A is an inverted staggered thin film transistor including the buffer layer 106 which includes the pair of conductive layers 104a and 104b and the metal oxide layer 105 and is provided between the oxide semiconductor layer 103 and each of the source electrode layer 107a and the drain electrode layer 107b.

Figure 1B:
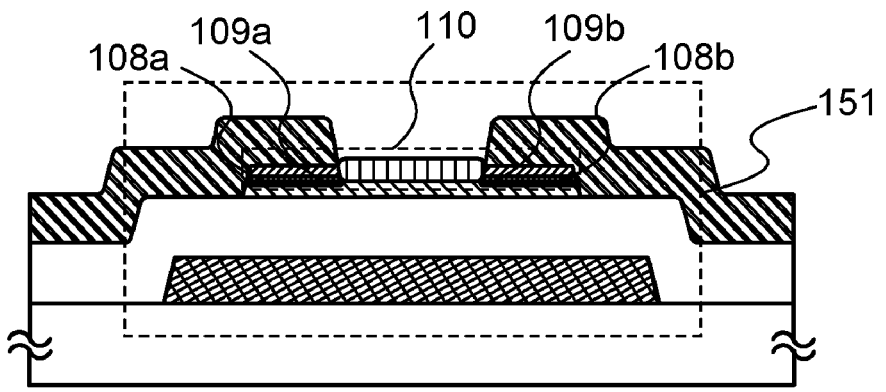

FIG. 1B illustrates a cross-sectional view of a thin film transistor 151 formed over a substrate. The thin film transistor 151 has a structure of the thin film transistor 150 in FIG. 1A. In addition, the thin film transistor 151 includes a pair of oxide semiconductor layers 108a and 108b whose oxygen concentration is lowered and which are provided over the opposite end portions of the oxide semiconductor layer 103, and a pair of conductive layers 109a and 109b containing oxygen at high concentration and provided over the pair of oxide semiconductor layers 108a and 108b whose oxygen concentration is lowered.

In other words, the thin film transistor 151 in FIG. 1B is an inverted staggered thin film transistor including a buffer layer 110 which is provided between the oxide semiconductor layer 103 and each of the source electrode layer 107a and the drain electrode layer 107b. The buffer layer 110 includes the pair of conductive layers 104a and 104b, the metal oxide layer 105, the pair of oxide semiconductor layers 108a and 108b whose oxygen concentration is lowered, and the pair of conductive layers 109a and 109b containing oxygen at high concentration.

As the substrate 100, a glass substrate such as barium borosilicate glass or aluminoborosilicate glass or the like can be used.

As the gate electrode layer 101, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the gate insulating layer 102, an insulator such as silicon oxide, silicon nitride, silicon oxynitride, silicon nitride oxide, aluminum oxide, or tantalum oxide can be used. Alternatively, a stacked structure of these insulators can be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, silicon nitride oxide refers to a substance which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

As the oxide semiconductor layer 103, an oxide semiconductor such as an In—Ga—Zn—O-based oxide semiconductor, an In—Sn—Zn—O-based oxide semiconductor, an In—Zn—O-based oxide semiconductor, a Sn—Zn—O-based oxide semiconductor, an In—Sn—O-based oxide semiconductor, a Ga—Zn—O-based oxide semiconductor, or a Zn—O-based oxide semiconductor can be used. Alternatively, an oxide semiconductor formed by adding nitrogen (N) or silicon (Si) to any of the above oxide semiconductors can be used. A stacked structure of these materials can also be used.

As the pair of conductive layers 104a and 104b, titanium (Ti), copper (Cu), zinc (Zn), aluminum (Al), or the like can be used. Alternatively, an alloy containing any of these metal elements can be used. A stacked structure of these materials can also be used.

As the metal oxide layer 105, the same material as the pair of conductive layers 104a and 104b can be used. Note that the metal oxide layer 105 has higher oxygen concentration than the pair of conductive layers 104a and 104b. That is, the metal oxide layer 105 contains the same metal element as the pair of conductive layers 104a and 104b, and has higher oxygen concentration than the pair of conductive layers 104a and 104b.

As the source electrode layer 107a and the drain electrode layer 107b, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the pair of oxide semiconductor layers 108a and 108b whose oxygen concentration is lowered, the same material as the oxide semiconductor layer 103 can be used. Note that the pair of oxide semiconductor layers 108a and 108b whose oxygen concentration is lowered has lower oxygen concentration than the oxide semiconductor layer 103. That is, the pair of oxide semiconductor layers 108a and 108b whose oxygen concentration is lowered contains the same metal element as the oxide semiconductor layer 103, and has lower oxygen concentration than the oxide semiconductor layer 103.

As the pair of conductive layers 109a and 109b containing oxygen at high concentration, the same material as the pair of conductive layers 104a and 104b and the metal oxide layer 105 can be used. Note that the pair of conductive layers 109a and 109b containing oxygen at high concentration has higher oxygen concentration than the pair of conductive layers 104a and 104b, and has lower oxygen concentration than the metal oxide layer 105. That is, the pair of conductive layers 109a and 109b containing oxygen at high concentration contains the same metal element as the pair of conductive layers 104a and 104b and the metal oxide layer 105, and has higher oxygen concentration than the pair of conductive layers 104a and 104b and lower oxygen concentration than the metal oxide layer 105.

The thin film transistor 150 in FIG. 1A includes the buffer layer 106 between the oxide semiconductor layer 103 and each of the source electrode layer 107a and the drain electrode layer 107b. The buffer layer 106 includes the metal oxide layer 105, which is the insulator or the semiconductor, over the middle portion of the oxide semiconductor layer 103. The metal oxide layer 105 functions as a protective layer for suppressing incorporation of impurities (such as hydrogen and moisture) into the oxide semiconductor layer 103. Therefore, in the thin film transistor 150, an increase in off current or negative shift of the threshold voltage can be prevented.

The buffer layer 110 of the thin film transistor 151 in FIG. 1B includes the metal oxide layer 105 for preventing an increase in off current or negative shift of the threshold voltage, and the pair of oxide semiconductor layers 108a and 108b whose oxygen concentration is lowered and which are provided over the opposite end portions of the oxide semiconductor layer 103. The pair of oxide semiconductor layers 108a and 108b whose oxygen concentration is lowered has lower resistance than the oxide semiconductor layer 103. Therefore, ohmic contact between the oxide semiconductor layer 103 and each of the source electrode layer 107a and the drain electrode layer 107b can be obtained.

Embodiment 2

In this embodiment, one example of a method for manufacturing the thin film transistor described in Embodiment 1 will be described with reference to FIGS. 2A to 2D and FIGS. 3A to 3D.

Note that in this embodiment, the term "film" means something which is formed over the entire surface of a substrate and is to be processed into a desired shape in a subsequent photolithography step or the like, and something before the processing. The term "layer" means something obtained by processing and shaping a "film" into a desired shape by a photolithography step or the like, or something to be formed over the entire surface of a substrate.

Figure 2A:
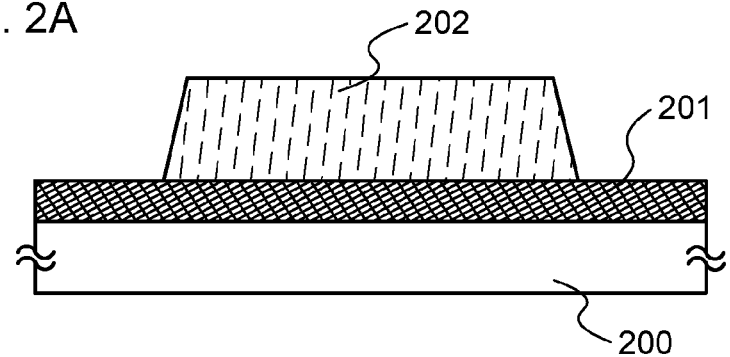
FIGS. 2A to 2D are cross-sectional views illustrating a manufacturing process of a thin film transistor described in Embodiment 2.

A first conductive film 201 is formed over a substrate 200. The first conductive film 201 can be formed by a thin film deposition method typified by a sputtering method, a vacuum evaporation method, a pulsed laser deposition method, an ion plating method, a metal organic chemical vapor deposition method, or the like. Next, a first resist 202 is formed over the first conductive film 201. FIG. 2A is a cross-sectional view after the above steps are completed.

Figure 2B:
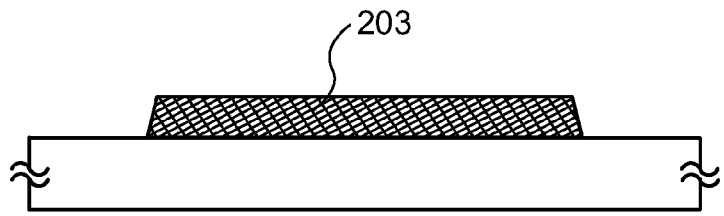

Next, with use of the first resist 202 as a mask, the first conductive film 201 is selectively etched to form a gate electrode layer 203. Note that the materials described in Embodiment 1 can be used for the substrate 200 and the first conductive film 201 (the gate electrode layer 203); therefore, here, the above description is to be referred to. The first resist 202 is removed after the gate electrode layer 203 is formed. FIG. 2B is a cross-sectional view after the above steps are completed.

Next, a gate insulating layer 204 is formed over the substrate 200 and the gate electrode layer 203. The gate insulating layer 204 can be formed by a thin film deposition method typified by a sputtering method, a vacuum evaporation method, a pulsed laser deposition method, an ion plating method, a metal organic chemical vapor deposition method, a plasma CVD method, or the like.

Next, an oxide semiconductor film 205 is formed. The oxide semiconductor film 205 can be formed by a thin film deposition method typified by a sputtering method, a vacuum evaporation method, a pulsed laser deposition method, an ion plating method, a metal organic chemical vapor deposition method, or the like. In the case where an In—Ga—Zn—O-based oxide semiconductor film is formed by a sputtering method, it is preferable to use a target made by sintering $In_2O_3$, $Ga_2O_3$, and ZnO. As a sputtering gas, a rare gas typified by argon is used. One example of the formation conditions by sputtering is as follows: a target made by mixing and sintering $In_2O_3$, $Ga_2O_3$, and ZnO (1:1:1) is used; the pressure is 0.4 Pa; the direct current (DC) power source is 500 W; the flow rate of an argon gas is 30 sccm; and the flow rate of an oxygen gas is 15 sccm. After the oxide semiconductor film 205 is formed, thermal treatment is preferably performed at 100° C. to 600° C., typically 200° C. to 400° C. Through this thermal treatment, rearrangement at the atomic level occurs in the oxide semiconductor film. The thermal treatment (including optical annealing) is important because strain energy which inhibits carrier movement in the oxide semiconductor film 205 is released by the thermal treatment.

Figure 2C:
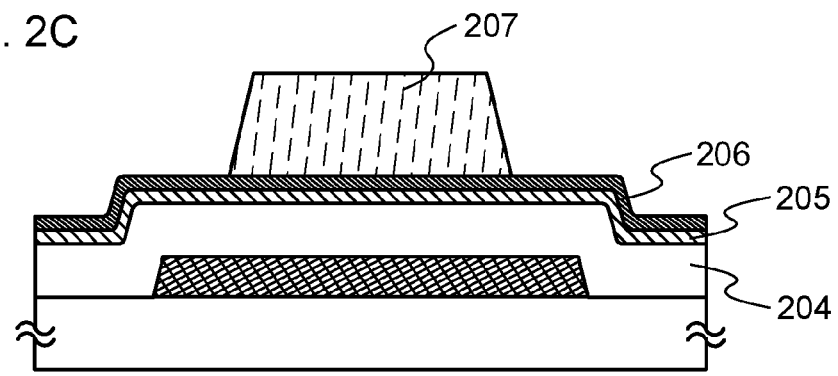
Figure 2D:
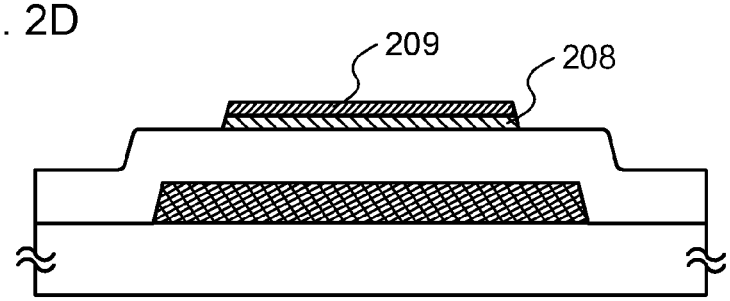

Next, a second conductive film 206 is formed over the oxide semiconductor film 205. The second conductive film 206 can be formed by a thin film deposition method typified by a sputtering method, a vacuum evaporation method, a pulsed laser deposition method, an ion plating method, a metal organic chemical vapor deposition method, or the like. As a material for the second conductive film 206, titanium (Ti), copper (Cu), zinc (Zn), aluminum (Al), or the like can be used. Alternatively, an alloy containing any of these metal elements can be used. A stacked structure of these materials can also be used. Next, a second resist 207 is formed over the second conductive film 206. FIG. 2C is a cross-sectional view after the above steps are completed.

Next, with use of the second resist 207 as a mask, the oxide semiconductor film 205 and the second conductive film 206 are selectively etched to form an oxide semiconductor layer 208 and a conductive layer 209. Note that the materials described in Embodiment 1 can be used for the gate insulating layer 204 and the oxide semiconductor film 205 (the oxide semiconductor layer 208); therefore, here, the above description is to be referred to. The second resist 207 is removed after the oxide semiconductor layer 208 and the conductive layer 209 are formed. FIG. 152D is a cross-sectional view after the above steps are completed.

Figure 3A:
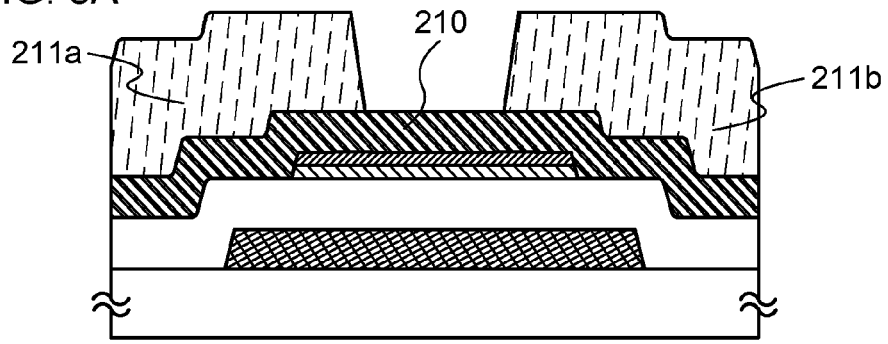
FIGS. 3A to 3D are cross-sectional views illustrating a manufacturing process of a thin film transistor described in Embodiment 2.

Next, a third conductive film 210 is formed over the gate insulating layer 204 and the conductive layer 209. The third conductive film 210 can be formed by a thin film deposition method typified by a sputtering method, a vacuum evaporation method, a pulsed laser deposition method, an ion plating method, a metal organic chemical vapor deposition method, or the like. Next, third resists 211a and 211b are formed over the third conductive film 210. FIG. 3A is a cross-sectional view after the above steps are completed.

Figure 3B:
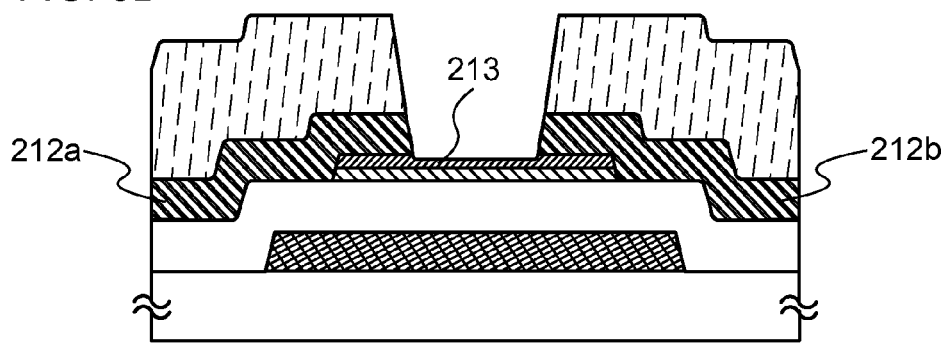

Next, with use of the third resists 211*a* and 211*b* as masks, the third conductive film 210 is selectively etched to form a source electrode layer 212*a* and a drain electrode layer 212*b*. Note that through this etching step, a region (an exposed portion) of the conductive layer 209, which does not overlap with the source electrode layer 212*a* or the drain electrode layer 212*b*, is partly etched, whereby a conductive layer 213 having a recessed portion in the region (the exposed portion), which does not overlap with the source electrode layer 212*a* or the drain electrode layer 212*b*, is formed. Note that the materials described in Embodiment 1 can be used for the third conductive film 210 (the source electrode layer 212*a* and the drain electrode layer 212*b*); therefore, here, the above description is to be referred to. FIG. 3B is a cross-sectional view after the above steps are completed.

Figure 3C:
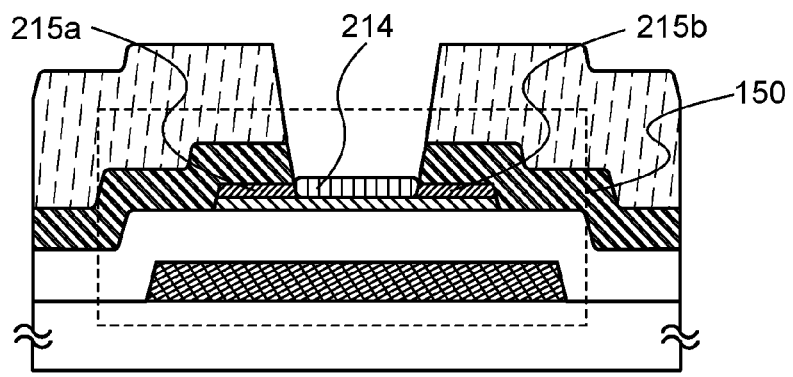

Next, with use of the third resists 211*a* and 211*b* as masks, oxidation treatment is performed. As the oxidation treatment, thermal oxidation treatment in an oxidizing atmosphere, plasma oxidation treatment, oxygen ion implantation, or the like can be used. It is possible to perform plural kinds of such treatment in combination; for example, thermal oxidation treatment in an oxidizing atmosphere is performed, and then, plasma oxidation treatment is performed. Note that as the oxidizing atmosphere in which the thermal oxidation treatment is performed, a dried oxygen atmosphere, a mixed atmosphere of oxygen and a rare gas, an atmospheric atmosphere, or the like can be used. Through the oxidation treatment, a middle portion (an exposed portion) of the conductive layer 213 provided over the oxide semiconductor layer 208 is oxidized to form a metal oxide layer 214 which is an insulator or a semiconductor. Further, at the same time as the formation of the metal oxide layer 214, a pair of conductive layers 215*a* and 215*b* is formed over opposite end portions of the oxide semiconductor layer 208. Specifically, by the source electrode layer 212*a*, the drain electrode layer 212*b*, and the third resists 211*a* and 211*b*, a region (a non-exposed portion) of the conductive layer 213, which overlaps with the source electrode layer 212*a* or the drain electrode layer 212*b*, is prevented from being oxidized. As a result, the pair of conductive layers 215*a* and 215*b* remains. Note that the volume of the region oxidized through the oxidation treatment is increased. That is, the volume of the metal oxide layer 214 is larger than that of the middle portion of the conductive layer 213 before being oxidized. FIG. 3C is a cross-sectional view after the above steps are completed. Through the steps described above, the thin film transistor 150 illustrated in FIG. 1A is completed.

Note that the thin film transistor of this embodiment is not limited to have the structure of FIG. 1A or FIG. 3C. Specifically, the thin film transistor having such a structure that only the region (the middle portion) of the conductive layer 213, which does not overlap with the source electrode layer 212*a* or the drain electrode layer 212*b*, is oxidized through the oxidation treatment to form the metal oxide layer 214 is illustrated in FIG. 1A and FIG. 3C; however, a thin film transistor in which another region is also oxidized is also included in the category of the thin film transistor of this embodiment. For example, a thin film transistor having such a structure that side portions of the source electrode layer 212*a* and the drain electrode layer 212*b*, which are not covered with the third resists 211*a* and 211*b*, respectively, are oxidized through the oxidation treatment is also included in the category of the thin film transistor of this embodiment. Note that in the case where the side portions of the source electrode layer 212*a* and the drain electrode layer 212*b* are oxidized, the oxidation is performed on only surfaces of the side portions of the source electrode layer 212*a* and the drain electrode layer 212*b*, whereby the source electrode layer 212*a* and the drain electrode layer 212*b* can function as electrodes. Similarly, a thin film transistor having such a structure that the region (the non-exposed portion) of the conductive layer 213, which overlaps with the source electrode layer 212*a* or the drain electrode layer 212*b*, is partly internally oxidized is also included in the category of the thin film transistor of this embodiment.

The thin film transistor in which the thickness of the metal oxide layer 214 formed through the oxidation treatment is larger than that of the pair of conductive layers 215*a* and 215*b* is illustrated in FIG. 1A and FIG. 3C; however, a thin film transistor in which the thickness of the metal oxide layer 214 is smaller than that of the pair of conductive layers 215*a* and 215*b* is also included in the category of the thin film transistor of this embodiment. Note that the metal oxide layer 214 is formed by performing oxidation treatment on the conductive layer 213 having the recessed portion. The recessed portion is formed in the etching step for forming the source electrode layer 212*a* and the drain electrode layer 212*b*. That is, the condition of the etching step for forming the source electrode layer 212*a* and the drain electrode layer 212*b* is adjusted, whereby the thickness of the metal oxide layer 214 can be adjusted. Specifically, the time of overetching for forming the source electrode layer 212*a* and the drain electrode layer 212*b* is prolonged, whereby the recessed portion can be deepened. Accordingly, the thickness of the metal oxide layer 214 can be smaller than that of the pair of conductive layers 215*a* and 215*b*.

Figure 3D:
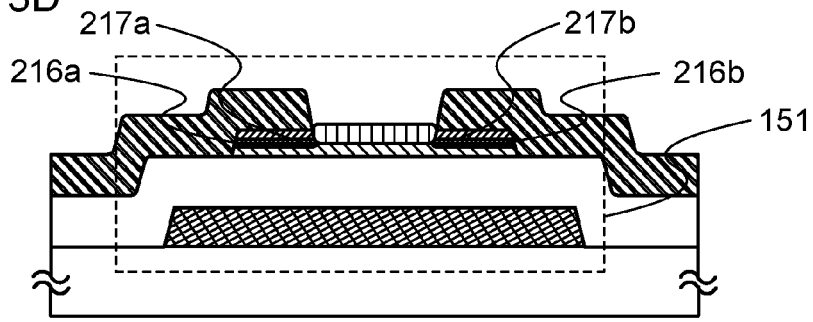

In the case where the thin film transistor 151 in FIG. 1B is manufactured, thermal treatment at 100° C. to 600° C., typically 200° C. to 400° C. is performed in a subsequent step. Through the thermal treatment, oxygen in the oxide semiconductor layer 208 is diffused into the pair of conductive layers 215*a* and 215*b*. Note that when diffusion of oxygen into the pair of conductive layers 215*a* and 215*b* is compared with diffusion of oxygen into the metal oxide layer 214, the amount of oxygen diffused into the pair of conductive layers 215*a* and 215*b* is larger than that into the metal oxide layer 214. Therefore, a pair of oxide semiconductor layers 216*a* and 216*b* whose oxygen concentration is lowered is formed over the opposite end portions of the oxide semiconductor layer 208, and a pair of conductive layers 217*a* and 217*b* containing oxygen at high concentration is formed over the pair of oxide semiconductor layers 216*a* and 216*b* whose oxygen concentration is lowered. After that, the third resists 211*a* and 211*b* are removed. FIG. 3D is a cross-sectional view after the above steps are completed.

Here, the manufacturing step in which thermal treatment performed in the case where the thin film transistor 151 in FIG. 1B is manufactured is performed after oxidation treatment is described; however, the timing of the thermal treatment is not particularly limited as long as it is after formation of the second conductive film 206. This thermal treatment also allows rearrangement at the atomic level in the oxide semiconductor layer 208.

In terms of characteristics of a thin film transistor to be formed, thermal treatment is preferably performed after oxidation treatment. This is because when thermal treatment is performed before oxidation treatment (before formation of the metal oxide layer 214), oxide semiconductor layers whose oxygen concentration is lowered are formed not only in upper portions of the opposite end portions of the oxide semiconductor layer 208 but also over the entire area of the oxide semiconductor layer 208; thus, off current of a thin film transistor to be formed is increased.

In addition, in terms of a manufacturing process, as the oxidation treatment, thermal oxidation treatment is preferably performed in an oxidizing atmosphere at a temperature at which the pair of oxide semiconductor layers 216a and 216b whose oxygen concentration is lowered and the pair of conductive layers 217a and 217b containing oxygen at high concentration are formed. This is because the metal oxide layer 214, the pair of oxide semiconductor layers 216a and 216b whose oxygen concentration is lowered, and the pair of conductive layers 217a and 217b containing oxygen at high concentration can be formed in the same step. One example of conditions for treatment serving as the oxidation treatment and the thermal treatment is thermal oxidation treatment at 350° C. for one hour in a dried oxygen atmosphere.

Further, in terms of reliability of a thin film transistor to be formed, thermal oxidation treatment and oxidation treatment are preferably performed in combination. When the thickness of the metal oxide layer 214 is made larger, a function as a protective layer for suppressing incorporation of impurities (such as hydrogen and moisture) into the oxide semiconductor layer 208 can be improved.

In the thin film transistor 150, the metal oxide layer 214 having a function of preventing an increase in off current or negative shift of the threshold voltage is formed on the basis of the conductive layer 209 (the conductive layer 213) which is formed in the same step as the oxide semiconductor layer 208; therefore, a high-performance thin film transistor can be efficiently formed. In a similar manner, in the thin film transistor 151, the metal oxide layer 214 having a function of preventing an increase in off current or negative shift of the threshold voltage is formed on the basis of the conductive layer 209 (the conductive layer 213) which is formed in the same step as the oxide semiconductor layer 208, and the pair of oxide semiconductor layers 216a and 216b whose oxygen concentration is lowered and which have a function of realizing ohmic contact between the oxide semiconductor layer 208 and each of the source electrode layer 212a and the drain electrode layer 212b is formed by diffusing oxygen into the pair of conductive layers 215a and 215b; therefore, a high-performance thin film transistor can be efficiently formed.

Embodiment 3

In this embodiment, one example of a semiconductor device in which the thin film transistor described in Embodiment 1 is used will be described. Specifically, a liquid crystal display device in which the thin film transistor is used as a thin film transistor provided in a pixel portion of an active matrix substrate will be described with reference to FIG. 4, FIG. 5, and FIG. 6. Next, the liquid crystal display device will be described.

Note that in a semiconductor device, since a source and a drain of a thin film transistor are switched with each other depending on the operating condition or the like, it is difficult to determine which is the source or the drain. Therefore, in this embodiment and the following embodiments, one of a source electrode layer and a drain electrode layer is referred to as a first electrode layer and the other thereof is referred to as a second electrode layer for distinction.

Figure 4:
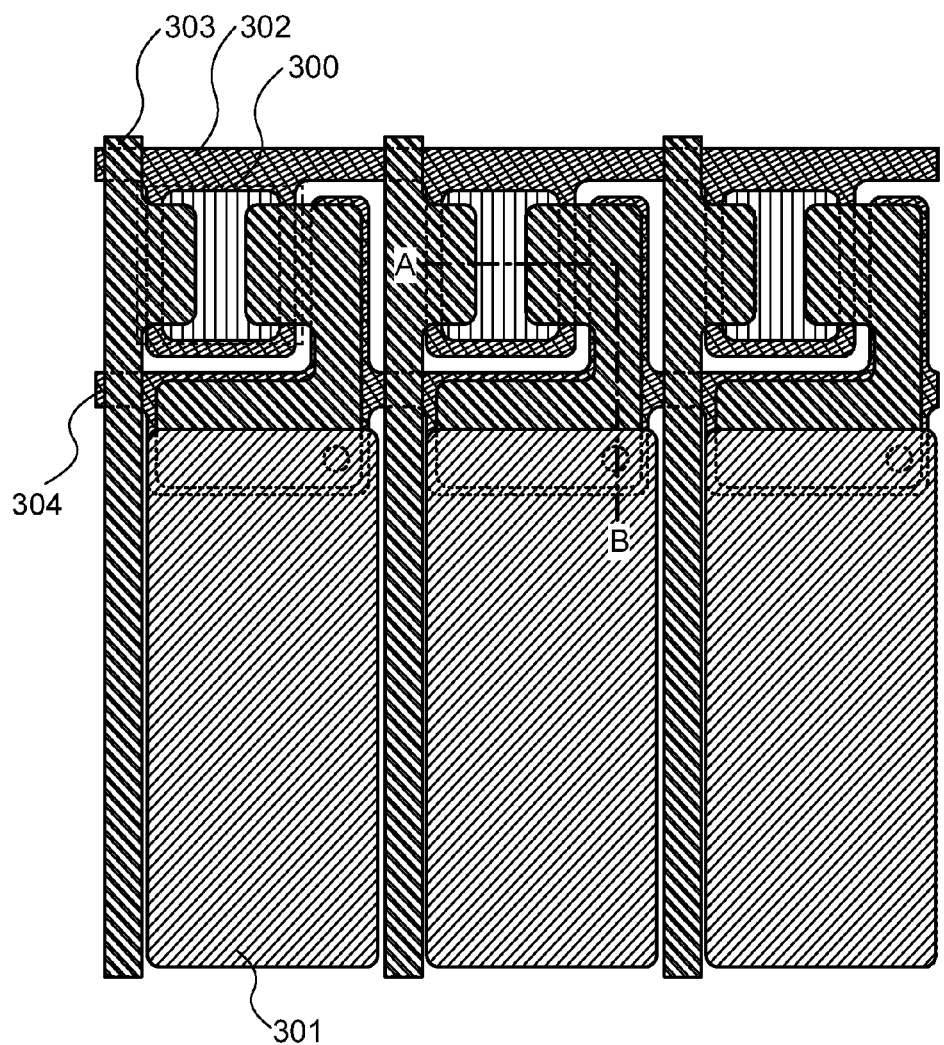
FIG. 4 is a top view illustrating a pixel of a liquid crystal display device described in Embodiment 3.

FIG. 4 is a top view illustrating one pixel of an active matrix substrate. Three sub-pixels are included in a pixel of a liquid crystal display device of this embodiment. Each sub-pixel is provided with a thin film transistor 300 and a pixel electrode 301 for applying voltage to a liquid crystal layer. The thin film transistor described in Embodiment 1 can be applied to the thin film transistor 300 in FIG. 4. In a pixel portion, a plurality of pixels described above are provided. In addition, a plurality of gate wirings 302, a plurality of source wirings 303, and a plurality of capacitor wirings 304 are provided.

Figure 5:
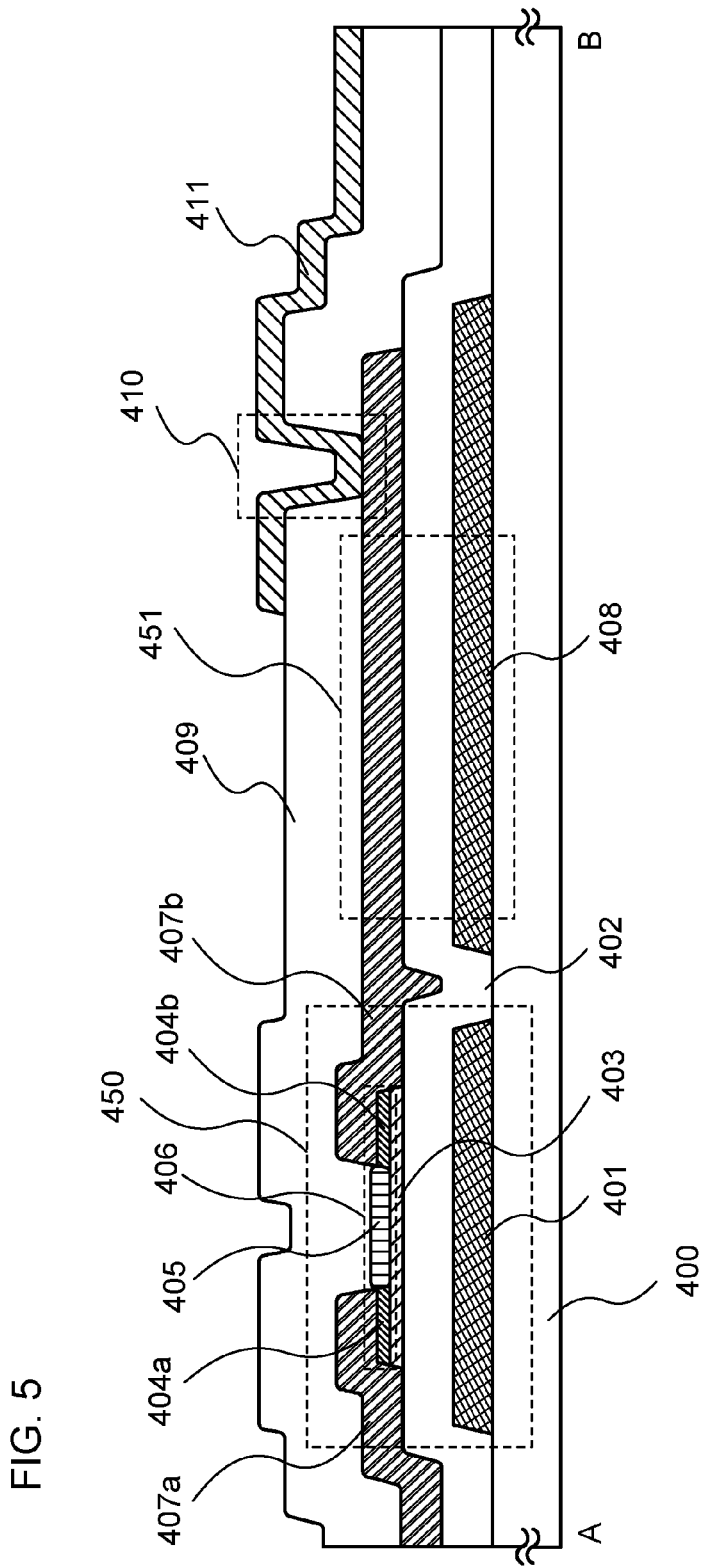
FIG. 5 is a cross-sectional view illustrating a pixel of a liquid crystal display device described in Embodiment 3.

FIG. 5 is a cross-sectional view taken along line A-B of FIG. 4. A thin film transistor 450 in FIG. 5 is the thin film transistor in FIG. 1A. That is, the thin film transistor 450 includes a gate electrode layer 401 provided over a substrate 400, a gate insulating layer 402 provided over the gate electrode layer 401, an oxide semiconductor layer 403 provided over the gate insulating layer 402, a buffer layer 406 including a pair of conductive layers 404a and 404b and a metal oxide layer 405 and provided over the oxide semiconductor layer 403, a first electrode layer 407a provided over the conductive layer 404a, and a second electrode layer 407b provided over the conductive layer 404b.

The materials described in Embodiment 1 and the manufacturing method described in Embodiment 2 can be applied to the substrate 400, the gate electrode layer 401, the gate insulating layer 402, the oxide semiconductor layer 403, the conductive layer 404a, the conductive layer 404b, the metal oxide layer 405, the buffer layer 406, the first electrode layer 407a, and the second electrode layer 407b; therefore, here, the above description is to be referred to.

The sub-pixel includes a capacitor 451. The capacitor 451 includes a capacitor wiring 408 formed from the same material as the gate electrode layer 401 of the thin film transistor 450, the gate insulating layer 402, and the second electrode layer 407b of the thin film transistor 450, which extends to the sub-pixel.

An interlayer insulating layer 409 is provided over the thin film transistor 450 and the capacitor 451. The thin film transistor 450 in FIG. 5 is provided with the metal oxide layer 405 for suppressing incorporation of impurities (such as hydrogen and moisture) into the oxide semiconductor layer 403; therefore, various materials and manufacturing methods can be used for the interlayer insulating layer 409. For example, as the interlayer insulating layer 409, a silicon oxide layer, a silicon oxynitride layer, a silicon nitride layer, a silicon nitride oxide layer, or the like can be formed by a plasma CVD method or a sputtering method. Further, the interlayer insulating layer 409 can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material corresponds to a material having a Si—O—Si bond. Siloxane has a skeleton structure with a bond of silicon (Si) and oxygen (O). As a substituent, an organic group (e.g., an alkyl group or aromatic hydrocarbon) or a fluoro group may be used. The organic group may include a fluoro group. The second electrode layer 407b in the thin film transistor 450 is electrically connected to a pixel electrode 411 through a contact hole 410 provided in the interlayer insulating layer 409.

Figure 6:
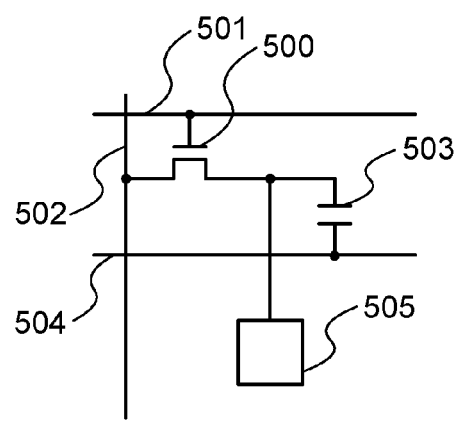
FIG. 6 is an equivalent circuit diagram illustrating a pixel of a liquid crystal display device described in Embodiment 3.

FIG. 6 is an equivalent circuit diagram corresponding to the sub-pixel in FIG. 4. A gate electrode of a thin film transistor 500 is electrically connected to a gate wiring 501, and a first electrode of the thin film transistor 500 is electrically connected to a source wiring 502. One electrode of a capacitor 503 is electrically connected to a second electrode of the thin film transistor 500, and the other electrode of the capacitor 503 is electrically connected to a capacitor wiring 504. A liquid crystal layer 505 to which voltage is applied through a pixel electrode is electrically connected to the second electrode of the thin film transistor 500 and to one electrode of the capacitor 503.

A liquid crystal display device includes a liquid crystal layer provided between an active matrix substrate and a counter substrate provided with a counter electrode on its surface. Alignment of liquid crystal molecules included in the liquid crystal layer is controlled by voltage applied between a pixel electrode of the active matrix substrate and the counter electrode of the counter substrate. The liquid crystal molecules of the liquid crystal layer are aligned to transmit or block light emitted from a backlight, whereby the liquid crystal display device can display images. In the liquid crystal display device, a thin film transistor in a pixel portion of the active matrix substrate is a switching element which controls voltage applied to the liquid crystal layer.

In the liquid crystal display device of this embodiment, the thin film transistor 450 in which the metal oxide layer 405 is provided over the oxide semiconductor layer 403 is used as a thin film transistor in a pixel portion of an active matrix substrate. The metal oxide layer 405 functions as a protective layer for suppressing incorporation of impurities (such as hydrogen and moisture) into the oxide semiconductor layer 403. Therefore, the material and manufacturing method of the interlayer insulating layer 409 can be selected depending on the purpose. As a result, a liquid crystal display device with high performance or high reliability can be provided. Note that the liquid crystal display device to which the thin film transistor in FIG. 1A is applied is described here; however, the same effect can be obtained also in the case where the thin film transistor in FIG. 1B is applied.

Embodiment 4

In this embodiment, one example of a semiconductor device in which the thin film transistor described in Embodiment 1 is used will be described. Specifically, a light-emitting display device in which the thin film transistor is applied to a thin film transistor provided in a pixel portion of an active matrix substrate will be described with reference to FIG. 7, FIG. 8, and FIG. 9. Next, a light-emitting display device of this embodiment will be described. Note that as a display element included in the light-emitting display device of this embodiment, a light-emitting element utilizing electroluminescence is described here. Light-emitting elements utilizing electroluminescence are classified according to whether a light-emitting material is an organic compound or an inorganic compound. In general, the former is referred to as organic EL elements and the latter as inorganic EL elements.

In an organic EL element, by application of voltage to a light-emitting element, electrons and holes are separately injected from a pair of electrodes into a layer containing a light-emitting organic compound, and current flows. Then, recombination of these carriers (the electrons and holes) causes the light-emitting organic compound to form an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 7:
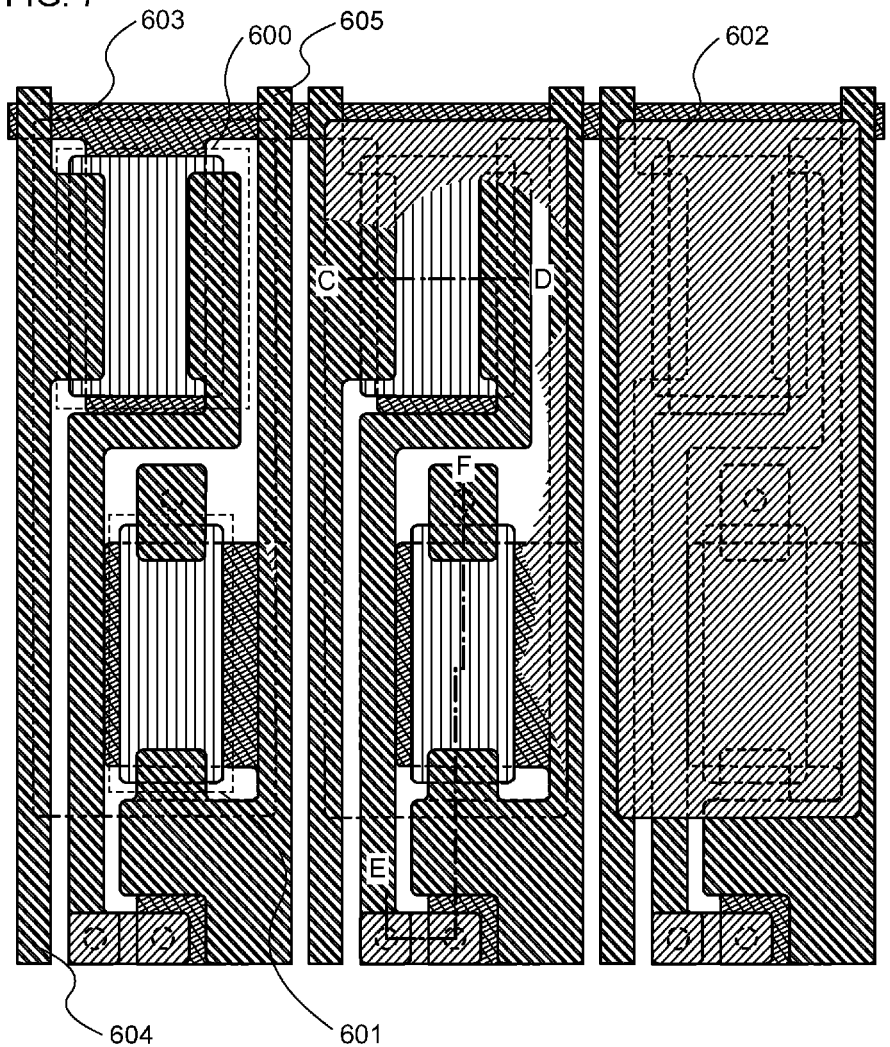
FIG. 7 is a top view illustrating a pixel of a light-emitting display device described in Embodiment 4.

FIG. 7 is a top view illustrating one pixel of an active matrix substrate. Three sub-pixels are included in a pixel of a light-emitting display device of this embodiment. Each sub-pixel is provided with thin film transistors 600 and 601 and a pixel electrode 602 for applying voltage to a light-emitting element (part of the pixel electrode 602 is not illustrated for convenience). The thin film transistor described in Embodiment 1 can be applied to the thin film transistors 600 and 601 in FIG. 6. A plurality of pixels described above are provided in a pixel portion. In addition, a plurality of gate wirings 603, a plurality of source wirings 604, and a plurality of power supply lines 605 are provided. Note that the power supply line 605 is set to have a high power supply potential VDD.

Figure 8:
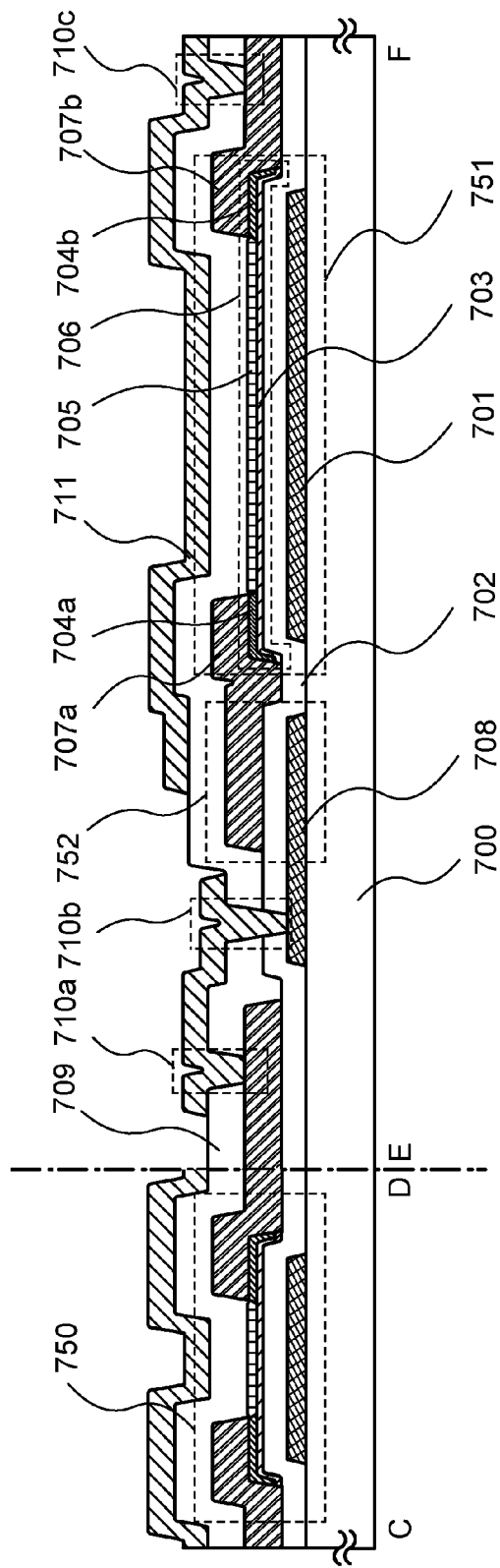
FIG. 8 is a cross-sectional view illustrating a pixel of a light-emitting display device described in Embodiment 4.

FIG. 8 is a cross-sectional view taken along lines C-D and E-F of FIG. 7. Thin film transistors 750 and 751 each correspond to the thin film transistor in FIG. 1A. That is, the thin film transistors 750 and 751 each include a gate electrode layer 701 provided over a substrate 700, a gate insulating layer 702 provided over the gate electrode layer 701, an oxide semiconductor layer 703 provided over the gate insulating layer 702, a buffer layer 706 including conductive layers 704a and 704b and a metal oxide layer 705 and provided over the oxide semiconductor layer 703, a first electrode layer 707a provided over the conductive layer 704a, and a second electrode layer 707b provided over the conductive layer 704b.

The materials described in Embodiment 1 and the manufacturing method described in Embodiment 2 can be applied to the substrate 700, the gate electrode layer 701, the gate insulating layer 702, the oxide semiconductor layer 703, the conductive layer 704a, the conductive layer 704b, the metal oxide layer 705, the buffer layer 706, the first electrode layer 707a, and the second electrode layer 707b; therefore, here, the above description is to be referred to.

The sub-pixel includes a capacitor 752. The capacitor 752 includes a capacitor wiring 708 formed from the same material as the gate electrode layer 701 of the thin film transistors 750 and 751, the gate insulating layer 702, and the first electrode layer 707a of the thin film transistor 751, which extends to the sub-pixel.

An interlayer insulating layer 709 is provided over the thin film transistors 750 and 751 and the capacitor 752. Each of the thin film transistors 750 and 751 in FIG. 8 is provided with the metal oxide layer 705 for suppressing incorporation of impurities (such as hydrogen and moisture) into the oxide semiconductor layer 703; therefore, various materials and manufacturing methods can be used for the interlayer insulating layer 709. For example, as the interlayer insulating layer 709, a silicon oxide layer, a silicon oxynitride layer, a silicon nitride layer, a silicon nitride oxide layer, or the like can be formed by a plasma CVD method or a sputtering method. Further, the interlayer insulating layer 709 can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material corresponds to a material having a Si—O—Si bond. Siloxane has a skeleton structure with a bond of silicon (Si) and oxygen (O). As a substituent, an organic group (e.g., an alkyl group or aromatic hydrocarbon) or a fluoro group may be used. The organic group may include a fluoro group. Contact holes 710a, 710b, and 710c are provided in the interlayer insulating layer 709.

The second electrode layer 707b of the thin film transistor 751 is electrically connected to a pixel electrode 711 through the contact hole 710c.

Figure 9:
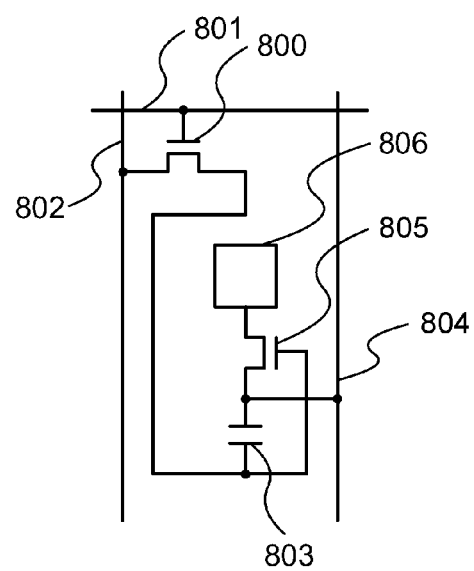
FIG. 9 is an equivalent circuit diagram illustrating a pixel of a light-emitting display device described in Embodiment 4.

FIG. 9 is an equivalent circuit diagram corresponding to the sub-pixel in FIG. 7. A gate electrode of a thin film transistor 800 is electrically connected to a gate wiring 801, and a first electrode of the thin film transistor 800 is electrically connected to a source wiring 802. One electrode of a capacitor 803 is electrically connected to a second electrode of the thin film transistor 800, and the other electrode of the capacitor 803 is electrically connected to a power supply line 804. A gate electrode of a thin film transistor 805 is electrically connected to the second electrode of the thin film transistor 800, and a first electrode of the thin film transistor 805 is electrically connected to the power supply line 804 and the other electrode of the capacitor 803. An organic EL element 806 to which voltage is applied through a pixel electrode is electrically connected to a second electrode of the thin film transistor 805.

A light-emitting display device includes an organic EL element provided over a pixel electrode of an active matrix substrate, and a common electrode provided over the organic EL element. Note that the common electrode is set to have a low power supply potential VSS. When voltage corresponding to a potential difference between the high power supply potential VDD supplied to the pixel electrode through the thin film transistor and the low power supply potential VSS supplied to the common electrode is applied to the organic EL element, current flows to the organic EL element so that the organic EL element emits light. In the light-emitting display device, a thin film transistor in a pixel portion of the active matrix substrate is a switching element which controls current flowing in the organic EL element.

In the light-emitting display device of this embodiment, the thin film transistors 750 and 751 in each of which the metal oxide layer 705 is provided over the oxide semiconductor layer 703 are used as thin film transistors in the pixel portion of the active matrix substrate. The metal oxide layer 705 functions as a protective layer for suppressing incorporation of impurities (such as hydrogen and moisture) into the oxide semiconductor layer 703. Therefore, the material and manufacturing method of the interlayer insulating layer 709 can be selected depending on the purpose. As a result, a light-emitting display device with high performance or high reliability can be provided. Note that here, the light-emitting display device to which the thin film transistor in FIG. 1A is applied is described; however, the same effect can be obtained also in the case where the thin film transistor in FIG. 1B is applied.

Embodiment 5

In this embodiment, one example of a semiconductor device in which the thin film transistor described in Embodiment 1 is used will be described. Specifically, an electronic paper in which the thin film transistor is applied to a thin film transistor provided for an active matrix substrate will be described with reference to FIG. 10. Next, an electronic paper of this embodiment will be described.

Figure 10:
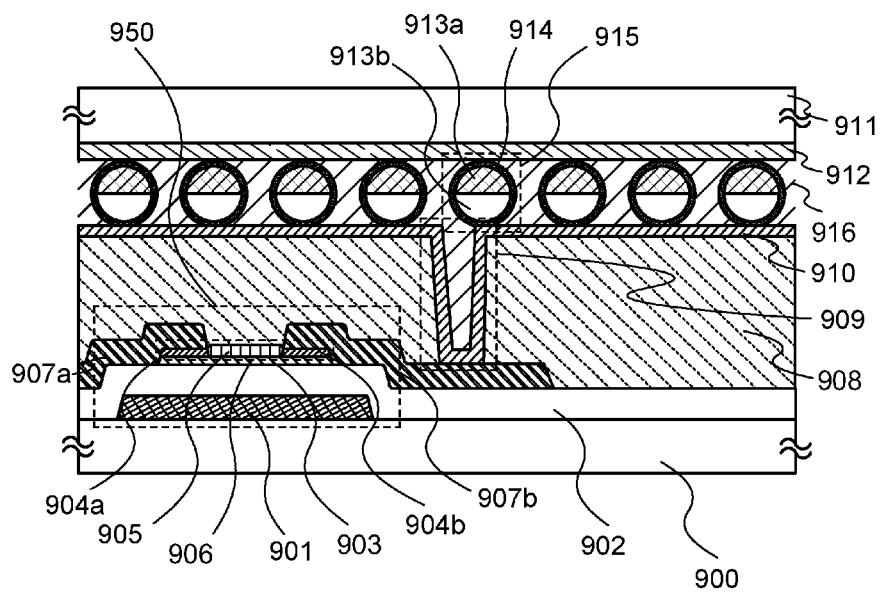
FIG. 10 is a cross-sectional view illustrating an electronic paper described in Embodiment 5.

FIG. 10 is a cross-sectional view of an active matrix electronic paper. A thin film transistor 950 provided over a first substrate (an active matrix substrate) 900 is the thin film transistor in FIG. 1A. That is, the thin film transistor 950 includes a gate electrode layer 901 provided over the first substrate 900, a gate insulating layer 902 provided over the gate electrode layer 901, an oxide semiconductor layer 903 provided over the gate insulating layer 902, a buffer layer 906 including a pair of conductive layers 904a and 904b and a metal oxide layer 905 and provided over the oxide semiconductor layer 903, a first electrode layer 907a provided over the conductive layer 904a, and a second electrode layer 907b provided over the conductive layer 904b.

The materials described in Embodiment 1 and the manufacturing method described in Embodiment 2 can be applied to the first substrate 900, the gate electrode layer 901, the gate insulating layer 902, the oxide semiconductor layer 903, the conductive layer 904a, the conductive layer 904b, the metal oxide layer 905, the buffer layer 906, the first electrode layer 907a, and the second electrode layer 907b; therefore, here, the above description is to be referred to.

An interlayer insulating layer 908 is provided over the thin film transistor 950. The thin film transistor 950 in FIG. 10 is provided with the metal oxide layer 905 for suppressing incorporation of impurities (such as hydrogen and moisture) into the oxide semiconductor layer 903; therefore, various materials and manufacturing methods can be used for the interlayer insulating layer 908. For example, as the interlayer insulating layer 908, a silicon oxide layer, a silicon oxynitride layer, a silicon nitride layer, a silicon nitride oxide layer, or the like can be formed by a plasma CVD method or a sputtering method. Further, the interlayer insulating layer 908 can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material corresponds to a material having a Si—O—Si bond. Siloxane has a skeleton structure with a bond of silicon (Si) and oxygen (O). As a substituent, an organic group (e.g., an alkyl group or aromatic hydrocarbon) or a fluoro group may be used. The organic group may include a fluoro group. A contact hole 909 is provided in the interlayer insulating layer 908. The second electrode layer 907b of the thin film transistor 950 is electrically connected to a pixel electrode 910 through the contact hole 909.

Between the pixel electrode 910 and a common electrode 912 which is provided for the second substrate 911, twisting balls 915 each having a black region 913a, a white region 913b, and a cavity 914 around the regions which is filled with liquid are provided. A space around the twisting balls 915 is filled with a filler 916 such as a resin.

An electronic paper in this embodiment employs a twisting ball display method. Twisting balls each colored in black or white are provided between a pixel electrode and a common electrode in the electronic paper. The twisting balls perform display in such a manner that the orientation is controlled by voltage application between the pixel electrode provided for the first substrate and the common electrode provided for the second substrate. In the electronic paper, a thin film transistor provided for an active matrix substrate is a switching element controlling voltage which is applied to twisting balls.

In the light-emitting display device of this embodiment, the thin film transistor 950 in which the metal oxide layer 905 is provided over the oxide semiconductor layer 903 is used as a thin film transistor provided for the active matrix substrate. The metal oxide layer 905 functions as a protective layer for suppressing incorporation of impurities (such as hydrogen and moisture) into the oxide semiconductor layer 903. Therefore, the material and manufacturing method of the interlayer insulating layer 908 can be selected depending on the purpose. As a result, an electronic paper with high performance or high reliability can be provided. Note that the electronic paper to which the thin film transistor in FIG. 1A is applied is described here; however, the same effect can be obtained also in the case where the thin film transistor in FIG. 1B is applied.

Example 1

Here, calculation results of change in electron states of titanium and titanium oxide depending on the difference in the content of oxygen, change in an electron state of an oxide semiconductor layer in accordance with oxygen deficiency, behavior of oxygen in the vicinity of a bonding interface between a titanium layer and an oxide semiconductor layer under thermal treatment, and behavior of oxygen in the vicinity of a bonding interface between a titanium oxide layer and an oxide semiconductor layer under thermal treatment are described. Next, the thin film transistor which is described in Embodiment 1 and in which titanium is applied to a composition material of the buffer layer is examined.

First, change in electron states of titanium and titanium oxide depending on the difference in the content of oxygen is examined. Here, results of obtaining the energy state density of crystal structures of titanium and a plurality of titanium oxides by structure optimization by the first-principle calculation using a plane wave-pseudopotential method based on density functional theory (DFT) are described. Specifically, graphs show the state density of Ti, TiO (NaCl type), $Ti_2O_3$ ($Al_2O_3$ type), $TiO_2$ (Anatase type), $TiO_2$ (Rutile type), and $TiO_2$ (Brookite type) after structures thereof are optimized. Note that CASTEP was used for a calculation program, and GGA-PBE was used for an exchange-correlation function.

Figure 11A:
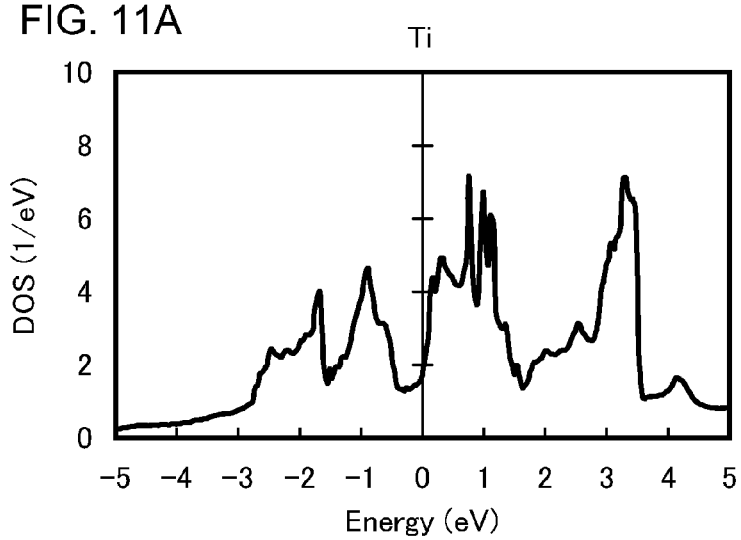
FIGS. 11A to 11C are graphs each showing density of a state obtained by calculation described in Example 1.
Figure 11B:
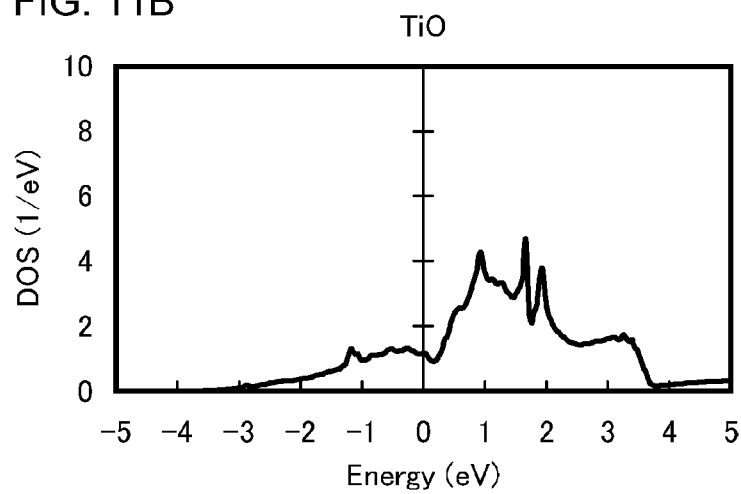
Figure 11C:
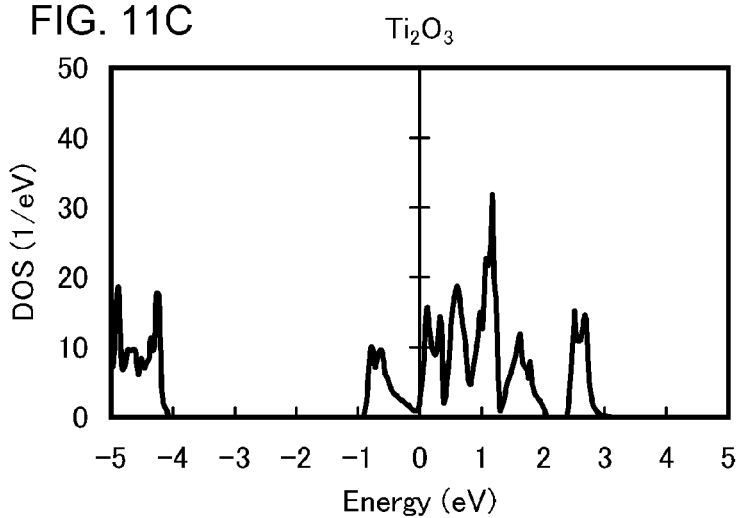

FIGS. 11A, 11B, and 11C show the state density of Ti, TiO (NaCl type), and $Ti_2O_3$ ($Al_2O_3$ type), respectively. In FIGS. 11A to 11C, there is no band gap. That is, Ti, TiO (NaCl type), and $Ti_2O_3$ ($Al_2O_3$ type) are conductors.

FIGS. 12A, 12B, and 12C show the state density of $TiO_2$ (Anatase type), $TiO_2$ (Rutile type), and $TiO_2$ (Brookite type), respectively. In FIGS. 12A to 12C, Fermi level (0 eV) is located in an upper end of the valence band, and there is a band gap. That is, each of $TiO_2$ (Anatase type), $TiO_2$ (Rutile type), and $TiO_2$ (Brookite type) is an insulator or a semiconductor.

It is confirmed from FIGS. 11A to 11C and FIGS. 12A to 12C that titanium keeps a property of a conductor when a predetermined amount of oxygen or less is included therein, and titanium comes to have a property of an insulator or a property of a semiconductor when a predetermined amount of oxygen or more is included therein.

Next, change in an electron state of an oxide semiconductor layer in accordance with oxygen deficiency is examined. Here, calculation is performed in the case where an In—Ga—Zn—O-based oxide semiconductor material (In:Ga:Zn:O=1:1:1:4) is used for an oxide semiconductor layer.

First, an amorphous structure of the In—Ga—Zn—O-based oxide semiconductor was formed by a melt-quench method using classical molecular dynamics simulation. Note that the amorphous structure formed here is as follows: the total number of atoms is 84; and the density is 5.9 g/cm³. Born-Mayer-Huggins potential was used for the interatomic potential between metal and oxygen and between oxygen and oxygen, and Lennard-Jones potential was used for the interatomic potential between metal and metal. NTV ensemble was used for calculation. Materials Explorer was used as a calculation program.

After that, annealing by first-principle molecular dynamics (hereinafter also referred to as first-principle MD) using a plane wave-pseudopotential method based on density functional theory (DFT) was performed at a room temperature (298 K) on the structure obtained by the above calculation in order to optimize the structure. Then, the state density was calculated. In addition, first-principle MD calculation was used for calculation, optimization of the structure was performed on a structure in which one of oxygen atoms was removed randomly (a structure with oxygen deficiency), and the state density was calculated. Note that CASTEP was used as a calculation program; and GGA-PBE, an exchange-correlation function. First-principle MD was used for calculation by using NTV ensemble.

Figure 13A:
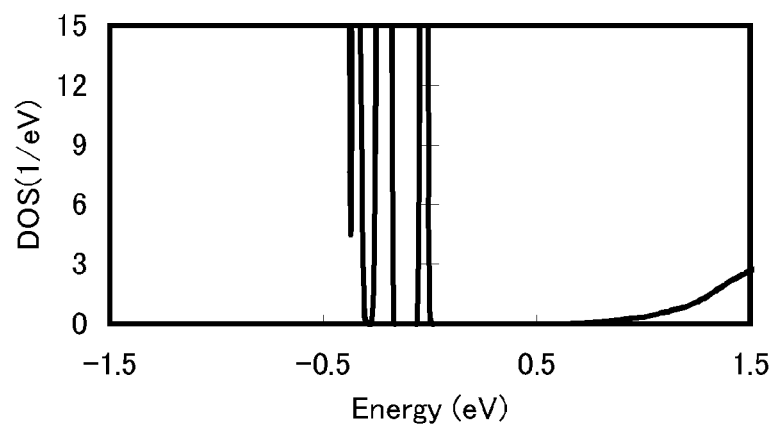
FIGS. 13A and 13B are graphs each showing density of a state obtained by calculation described in Example 1.
Figure 13B:
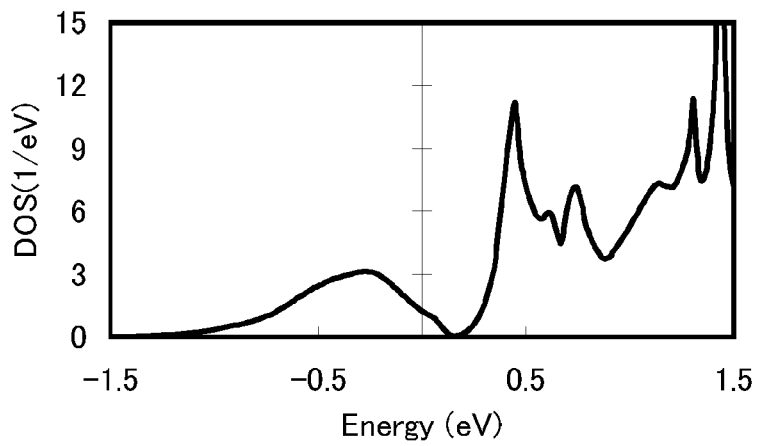

FIGS. 13A and 13B each show the state density of the In—Ga—Zn—O-based oxide semiconductor obtained by the above calculation. FIG. 13A shows the state density of a structure without oxygen deficiency, and FIG. 13B shows the state density of a structure with oxygen deficiency. In FIG. 13A, Fermi level (0 eV) is located in an upper end of the valence band and there is a band gap, while in FIG. 13B, Fermi level (0 eV) is located in the conduction band. That is, it is confirmed that the structure with oxygen deficiency has lower resistance than the structure without oxygen deficiency.

Next, behavior of oxygen in the vicinity of a bonding interface between a titanium layer and an oxide semiconductor layer under thermal treatment is examined. Here, titanium was deposited over the amorphous structure of the In—Ga—Zn—O-based oxide semiconductor obtained by the above first-principle calculation, and optimization of the structure was performed. Then, first-principle MD was used for calculation by using NTV ensemble. CASTEP was used as a calculation program; and GGA-PBE, an exchange-correlation function. The temperature was set at 350° C. (623 K).

Figure 14A:
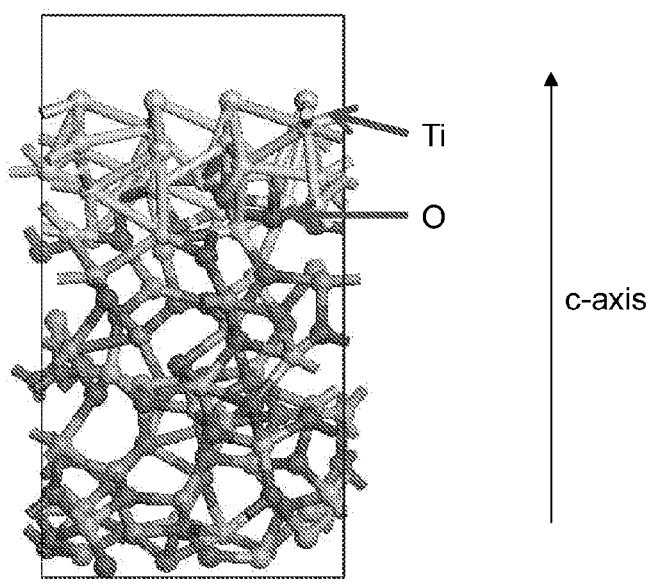
FIGS. 14A and 14B are diagrams showing atomic arrangement before and after thermal treatment at a bonding interface between a titanium layer and an In—Ga—Zn—O-based oxide semiconductor layer, which are obtained by calculation described in Example 1.
Figure 14B:
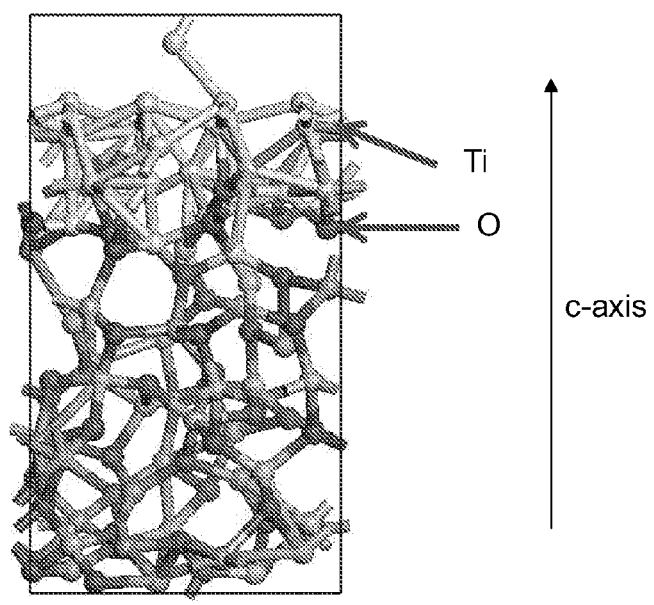
Figure 15:
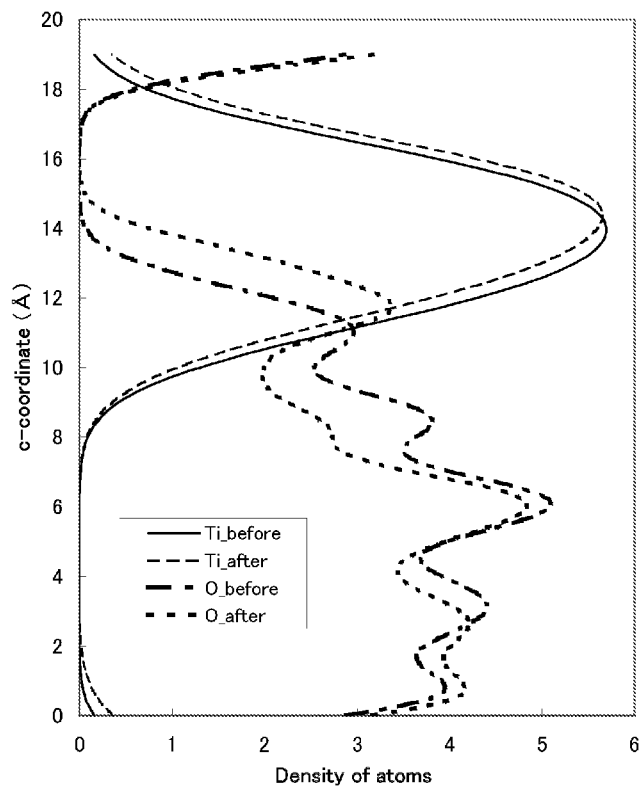
FIG. 15 is a graph showing titanium concentration and oxygen concentration before and after thermal treatment at a bonding interface between a titanium layer and an In—Ga—Zn—O-based oxide semiconductor layer, which are obtained by calculation described in Example 1.

FIGS. 14A and 14B show the structures before and after first-principle MD. FIG. 14A shows the structure before first-principle MD, and FIG. 14B shows the structure after first-principle MD. Further, FIG. 15 shows the density of titanium and oxygen in the c-axis direction before and after first-principle MD. FIG. 15 shows the density distribution obtained by assigning each atom in FIGS. 14A and 14B Gaussian distribution density and summing all the atoms. In FIG. 15, the horizontal axis represents the atom density, and the vertical axis represents the c-axis. Curves in FIG. 15 represent the density of titanium before first-principle MD (Ti_before), the density of titanium after first-principle MD (Ti_after), the density of oxygen before first-principle MD (O_before), and the density of oxygen after first-principle (O_after). It is found from FIG. 15 that O_after is shifted toward the positive direction of the c-axis as compared with O_before, and the concentration of oxygen contained in titanium after first-principle MD is increased as compared with that before first-principle MD. That is, it is found that through the thermal treatment at 350° C. (623 K), oxygen in the oxide semiconductor layer is diffused into the titanium layer.

Next, behavior of oxygen in the vicinity of a bonding interface between the titanium oxide (here, $TiO_2$ (Rutile type) was used) layer and the oxide semiconductor layer under thermal treatment is examined. Here, $TiO_2$ (Rutile type) was deposited over the amorphous structure of the In—Ga—Zn—O-based oxide semiconductor obtained by the first-principle calculation, and optimization of the structure was performed, and then, first-principle MD was used for calculation by using NTV ensemble. CASTEP was used as a calculation program; and GGA-PBE, an exchange-correlation function. The temperature was set at 700° C. (973 K).

Figure 16A:
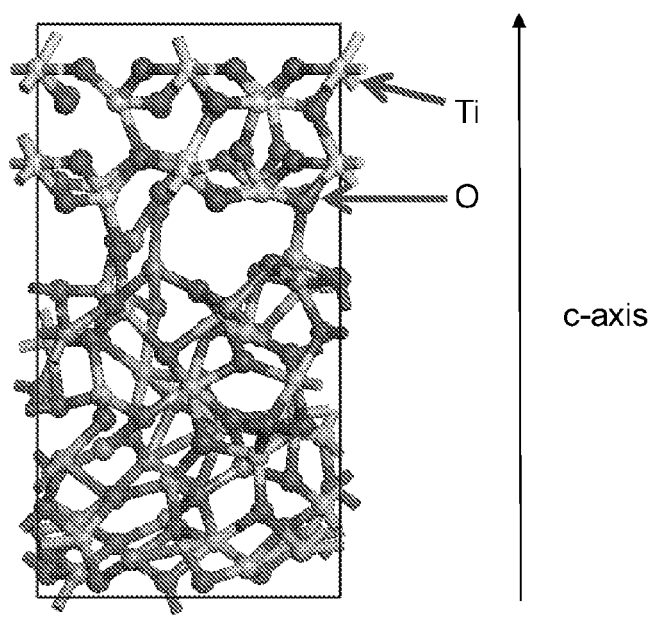
FIGS. 16A and 16B are diagrams showing atomic arrangement before and after thermal treatment at a bonding interface between a titanium oxide layer and an In—Ga—Zn—O-based oxide semiconductor layer, which are obtained by calculation described in Example 1.
Figure 16B:
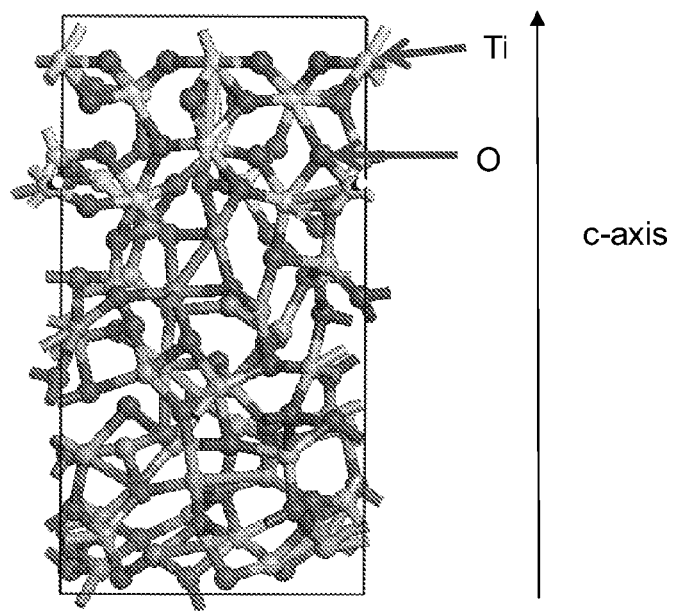
Figure 17:
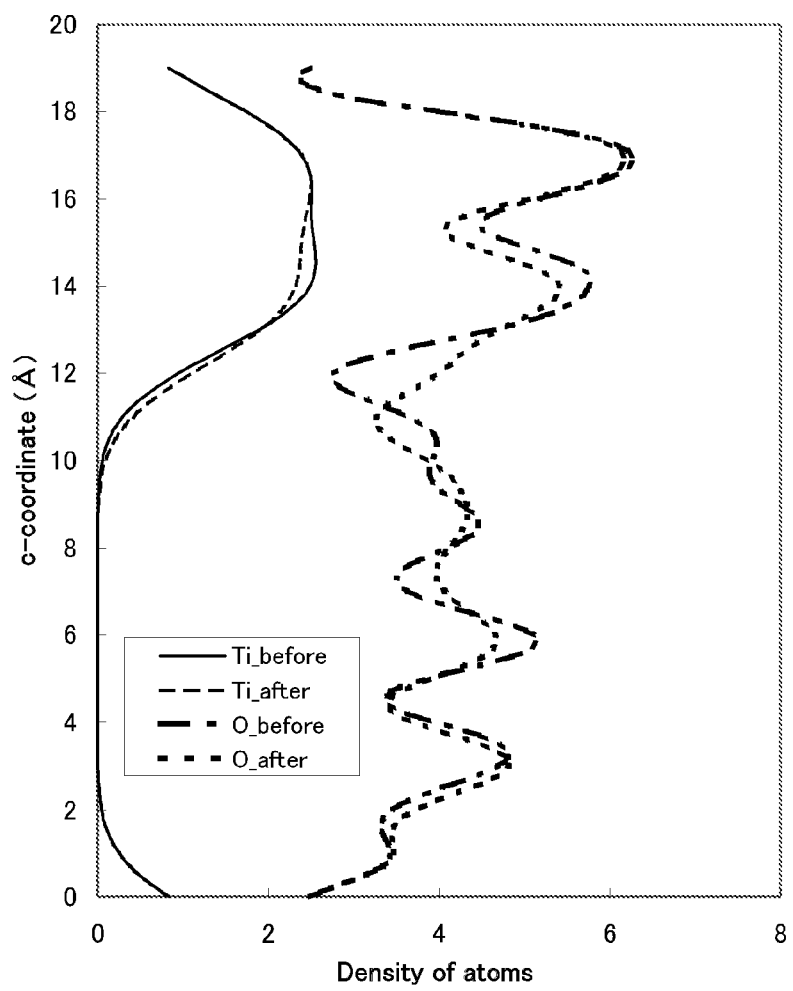
FIG. 17 is a graph showing titanium concentration and oxygen concentration before and after thermal treatment at a bonding interface between a titanium oxide layer and an In—Ga—Zn—O-based oxide semiconductor layer, which are obtained by calculation described in Example 1.

FIGS. 16A and 16B show the structures before and after first-principle MD. FIG. 16A shows the structure before first-principle MD, and FIG. 16B shows the structure after first-principle MD. Further, FIG. 17 shows the density of titanium and oxygen in the c-axis direction before and after first-principle MD. FIG. 17 shows the density distribution obtained by assigning each atom in FIGS. 16A and 16B Gaussian distribution density and summing all the atoms. In FIG. 17, the horizontal axis represents the atom density, and the vertical axis represents the c-axis. Curves in FIG. 17 represent the density of titanium before first-principle MD (Ti_before), the density of titanium after first-principle MD (Ti_after), the density of oxygen before first-principle MD (O_before), and the density of oxygen after first-principle MD (O_after). Unlike in FIG. 15, there is not a large difference between O_after and O_before in FIG. 17. That is, it is found that even when the thermal treatment at 700° C. (973 K) is performed, diffusion of oxygen between the oxide semiconductor layer and the $TiO_2$ (Rutile type) layer is not actively performed as compared with diffusion of oxygen between the oxide semiconductor layer and the titanium layer at 350° C.

Calculation results performed in this example are summarized below.

It is found from FIGS. 11A to 11C and FIGS. 12A to 12C that a plurality of titanium oxides have different electron states, and when the oxygen concentration is increased, the titanium oxide comes to have a property of an insulator or a property of a semiconductor. Specifically, it is found that TiO (NaCl type) and $Ti_2O_3$ ($Al_2O_3$ type) are conductors, and each of $TiO_2$ (Anatase type), $TiO_2$ (Rutile type), and $TiO_2$ (Brookite type) is an insulator or a semiconductor. That is, it is found that a titanium oxide comes to have a property of an insulator or a property of a semiconductor when the content of oxygen is large, and its electron density is changed depending on the ratio of oxygen.

It is found from FIGS. 13A and 13B that, when the In—Ga—Zn—O-based oxide semiconductor has the structure with oxygen deficiency, the electron state is changed and the resistance is lowered. Note that in FIGS. 13A and 13B, the amorphous structure whose total number of atoms is 84 (In: Ga:Zn:O=1:1:1:4) is compared with the structure in which one of oxygen atoms is removed from the amorphous structure. In other words, the structure whose oxygen concentration is about 57.1 atomic % (48 (the number of oxygen atoms)/84 (the number of total atoms)) is compared with the structure whose oxygen concentration is about 56.6 atomic % (47 (the number of oxygen atoms)/83 (the number of total atoms)). Accordingly, the In—Ga—Zn—O-based oxide semiconductor is a material whose change in oxygen concentration greatly affects the electron state as compared with titanium described above.

It is found from FIGS. 14A and 14B and FIG. 15 that oxygen in the In—Ga—Zn—O-based oxide semiconductor layer is diffused into the titanium layer when the thermal treatment at 350° C. is performed on the titanium layer and the In—Ga—Zn—O-based oxide semiconductor layer. In other words, it is found that the titanium layer containing oxygen at higher concentration than the titanium layer before the thermal treatment and the oxide semiconductor layer whose oxygen concentration is lower than the oxide semiconductor before the thermal treatment are formed through the thermal treatment. It is thought that, when considering an effect of change in the oxygen concentration of the titanium layer and the In—Ga—Zn—O-based oxide semiconductor layer on the electron states thereof, the resistance of the titanium layer containing oxygen at high concentration is not increased so much as compared with that of the titanium layer, and the resistance of the oxide semiconductor layer whose oxygen concentration is lowered is reduced as compared with that of the oxide semiconductor layer.

It is found from FIGS. 16A and 16B and FIG. 17 that even when the thermal treatment at a temperature as high as 700° C. is performed on a stack of the $TiO_2$ (Rutile type) layer and the In—Ga—Zn—O-based oxide semiconductor layer, diffusion of oxygen from the oxide semiconductor layer to the titanium layer is not actively performed as compared with diffusion of oxygen from the oxide semiconductor layer to the titanium layer at 350° C. In other words, it is found that the oxide semiconductor layer whose oxygen concentration is lower than that of the stack of the oxide semiconductor layer and the titanium layer is not easily formed even when the thermal treatment is performed.

Next, the case where titanium is applied to the buffer layer in the thin film transistor described in Embodiment 1 is examined. By performing oxidation treatment on the titanium layer, a titanium oxide such as $TiO_2$ (Anatase type), $TiO_2$ (Rutile type), or $TiO_2$ (Brookite type) which is an insulator or a semiconductor is formed to be used as a metal oxide layer included in the buffer layer. By performing thermal treatment at 350° C., oxygen in the oxide semiconductor layer is diffused into the titanium layer, whereby a titanium layer containing oxygen at high concentration and an oxide semiconductor layer whose oxygen concentration is lowered are formed. Therefore, the resistance of the oxide semiconductor layer can be effectively reduced, and ohmic contact between the oxide semiconductor layer and each of the source electrode layer and the drain electrode layer can be obtained through the buffer layer. In addition, diffusion of oxygen does not easily occur at an interface between the oxide semiconductor layer and the metal oxide layer, as compared with at an interface between an oxide semiconductor layer and a conductive layer. Accordingly, the oxide semiconductor layer whose oxygen concentration is lowered and whose resistance is reduced is not easily formed at the interface between the oxide semiconductor layer and the metal oxide layer, whereby an increase in off current of the thin film transistor can be suppressed.

From the above, it is confirmed that titanium is preferably used as a material applied to the buffer layer in the thin film transistor described in Embodiment 1.

This application is based on Japanese Patent Application serial No. 2009-037912 filed with Japan Patent Office on Feb. 20, 2009, the entire contents of which are hereby incorporated by reference.

What is claimed is:

1. A transistor comprising:
    a gate electrode layer;
    a gate insulating layer provided over the gate electrode layer;
    an oxide semiconductor layer provided over the gate insulating layer;
    a pair of conductive layers provided over the oxide semiconductor layer;
    a metal oxide layer provided over the oxide semiconductor layer and between the pair of conductive layers, wherein the metal oxide layer contains a same metal element as the pair of conductive layers, and has a higher oxygen concentration than the pair of conductive layers;
    a source electrode layer provided over one of the pair of conductive layers; and
    a drain electrode layer provided over the other of the pair of conductive layers.

2. The transistor according to claim 1, further comprising, between the oxide semiconductor layer and each of the pair of conductive layers:
    a pair of oxide semiconductor layers whose oxygen concentration is lowered and which are provided over the oxide semiconductor layer; and
    a pair of conductive layers containing oxygen at high concentration and provided over the pair of oxide semiconductor layers whose oxygen concentration is lowered.

3. The transistor according to claim 1, wherein the metal oxide layer is an insulator.

4. The transistor according to claim 1, wherein the metal oxide layer is a semiconductor.

5. The transistor according to claim 1, wherein the pair of conductive layers is selected from titanium, copper, zinc, aluminum, or an alloy containing at least one of titanium, copper, zinc, and aluminum.

6. The transistor according to claim 1, further comprising an interlayer insulating layer provided over the source electrode layer and the drain electrode layer.

7. A transistor comprising:
a gate electrode layer;
a gate insulating layer provided over the gate electrode layer;
an oxide semiconductor layer provided over the gate insulating layer;
a pair of conductive layers provided over the oxide semiconductor layer;
a metal oxide layer provided over the oxide semiconductor layer and between the pair of conductive layers;
a source electrode layer provided over one of the pair of conductive layers; and
a drain electrode layer provided over the other of the pair of conductive layers.

8. The transistor according to claim 7, wherein the metal oxide layer is an insulator.

9. The transistor according to claim 7, wherein the metal oxide layer is a semiconductor.

10. The transistor according to claim 7, wherein the pair of conductive layers is selected from titanium, copper, zinc, aluminum, or an alloy containing at least one of titanium, copper, zinc, and aluminum.

11. The transistor according to claim 7, further comprising an interlayer insulating layer provided over the source electrode layer and the drain electrode layer.

12. The transistor according to claim 7, wherein end surfaces of the pair of conductive layers are aligned with end surfaces of the oxide semiconductor layer.

13. The transistor according to claim 7, wherein the metal oxide layer is thicker than the pair of conductive layers.

14. A transistor comprising:
a gate electrode layer;
a gate insulating layer provided over the gate electrode layer;
an oxide semiconductor layer provided over the gate insulating layer;
a pair of conductive layers provided over the oxide semiconductor layer;
a metal oxide layer provided over the oxide semiconductor layer and between the pair of conductive layers, wherein the metal oxide layer contains a same metal element as the pair of conductive layers;
a source electrode layer provided over one of the pair of conductive layers; and
a drain electrode layer provided over the other of the pair of conductive layers.

15. The transistor according to claim 14, wherein the metal oxide layer is an insulator.

16. The transistor according to claim 14, wherein the metal oxide layer is a semiconductor.

17. The transistor according to claim 14, wherein the pair of conductive layers is selected from titanium, copper, zinc, aluminum, or an alloy containing at least one of titanium, copper, zinc, and aluminum.

18. The transistor according to claim 14, further comprising an interlayer insulating layer provided over the source electrode layer and the drain electrode layer.

19. The transistor according to claim 14, wherein end surfaces of the pair of conductive layers are aligned with end surfaces of the oxide semiconductor layer.

20. The transistor according to claim 14, wherein the metal oxide layer is thicker than the pair of conductive layers.

21. A transistor comprising:
a gate electrode layer;
a gate insulating layer provided over the gate electrode layer;
an oxide semiconductor layer provided over the gate insulating layer;
a pair of conductive layers provided over the oxide semiconductor layer;
a metal oxide layer provided over the oxide semiconductor layer and between the pair of conductive layers, wherein the metal oxide layer has a higher oxygen concentration than the pair of conductive layers;
a source electrode layer provided over one of the pair of conductive layers; and
a drain electrode layer provided over the other of the pair of conductive layers.

22. The transistor according to claim 21, wherein the metal oxide layer is an insulator.

23. The transistor according to claim 21, wherein the metal oxide layer is a semiconductor.

24. The transistor according to claim 21, wherein the pair of conductive layers is selected from titanium, copper, zinc, aluminum, or an alloy containing at least one of titanium, copper, zinc, and aluminum.

25. The transistor according to claim 21, further comprising an interlayer insulating layer provided over the source electrode layer and the drain electrode layer.

26. The transistor according to claim 21, wherein end surfaces of the pair of conductive layers are aligned with end surfaces of the oxide semiconductor layer.

27. The transistor according to claim 21, wherein the metal oxide layer is thicker than the pair of conductive layers.

* * * * *